(12) United States Patent
Hirakawa

(10) Patent No.: US 7,370,928 B2
(45) Date of Patent: May 13, 2008

(54) DROPLET DISCHARGE CONTROL METHOD AND LIQUID DISCHARGE APPARATUS

(75) Inventor: Takashi Hirakawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 314 days.

(21) Appl. No.: 11/093,288

(22) Filed: Mar. 30, 2005

(65) Prior Publication Data

US 2005/0219297 A1 Oct. 6, 2005

(30) Foreign Application Priority Data

Mar. 31, 2004 (JP) ............................. 2004-107674

(51) Int. Cl.
*B41J 2/205* (2006.01)
(52) U.S. Cl. .......................................... 347/15; 347/57
(58) Field of Classification Search ............ 347/10–12, 347/40, 15, 57
See application file for complete search history.

(56) References Cited

U.S. PATENT DOCUMENTS 6,257,685 B1 * 7/2001 Ishikawa ..................... 347/10
6,450,604 B1 * 9/2002 Iwaishi et al. ................. 347/10

FOREIGN PATENT DOCUMENTS

| JP | 59-232877 A | 12/1984 |
| JP | 9-272226 A | 10/1997 |
| JP | 11-170516 A | 6/1999 |

* cited by examiner

*Primary Examiner*—Thinh Nguyen
(74) *Attorney, Agent, or Firm*—Birch, Stewart, Kolasch & Birch, LLP

(57) ABSTRACT

The method of controlling droplet discharge for a liquid discharge apparatus which discharges droplets from a discharge head onto a discharge receiving medium, the method comprises the steps of: successively discharging a plurality of droplets from the discharge head so that at least some of the droplets discharged to mutually adjacent deposition points on a surface of the discharge receiving medium overlap; and carrying out at least one form of control selected from control which modifies a droplet discharge amount so that the droplet discharge amount of at least some of the droplets of the plurality of successively discharged droplets becomes relatively larger sequentially, and control which modifies flight velocity of the droplets so that the flight velocity of at least some of the droplets of the plurality of successively discharged droplets relatively increases sequentially.

4 Claims, 16 Drawing Sheets

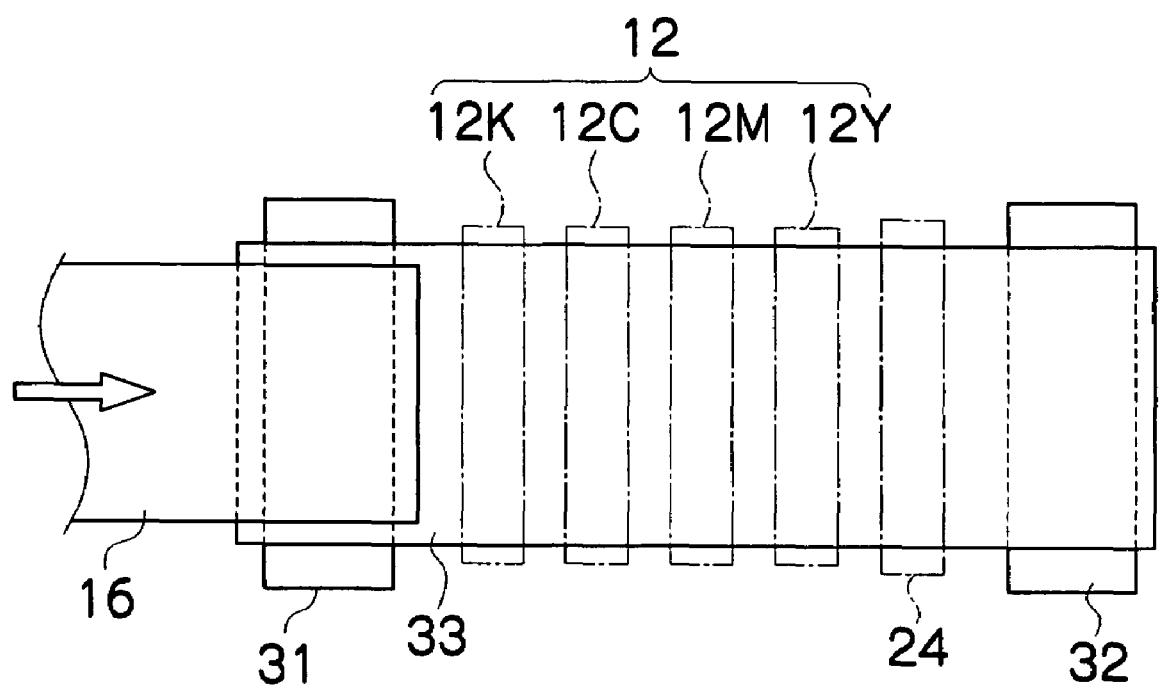

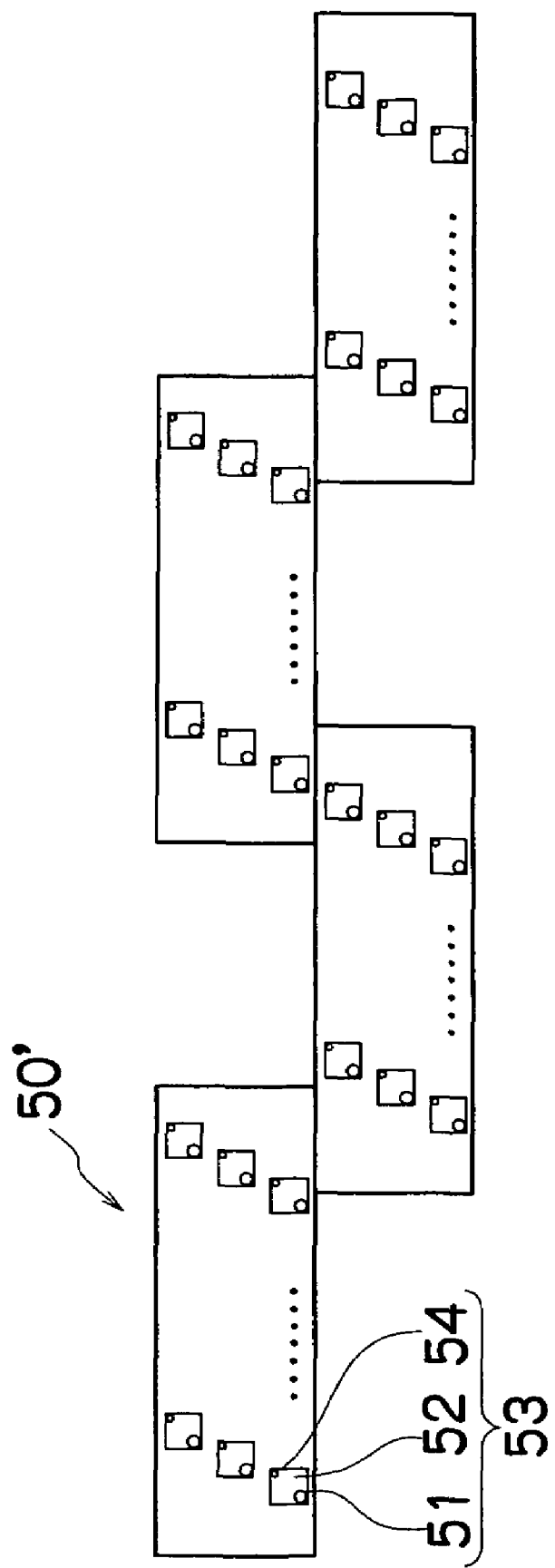

DROPLET DISCHARGE CONTROL METHOD AND LIQUID DISCHARGE APPARATUS

BACKGROUND OF THE INVENTION

1. Field of the Invention

The present invention relates to a droplet discharge control method, and a liquid discharge apparatus, and more particularly to a droplet discharge control technique which forms a favorable image, drawing, or another shape with consideration for the effect of mutual interference of the droplets as they land.

2. Description of the Related Art

In recent years, inkjet printers have come to be used widely as data output apparatuses for outputting images, documents, or the like. An inkjet printer forms data on recording paper by driving recording elements (nozzles) of a recording head in accordance with data, thereby causing ink to be ejected from the nozzles.

In an inkjet printer, a recording head with a large number of nozzles and a recording medium are relatively moved and a desired image is formed on the recording medium by ejecting ink droplets from the nozzles.

There is a demand for high-speed and high-quality printing in inkjet recording apparatuses, and high-speed printing is achieved by reducing the ink droplet discharge cycle, conveying the recording medium at high speed, and performing other techniques.

In order to print high-quality images, on the other hand, high-quality half-toning and higher resolution is achieved by making the dots that form the image more minute and ensuring higher density. Making the dots smaller is achieved by discharging ink in small amounts, for example, and increasing the density of the dots by forming with greater density the nozzles which eject ink. When the dots are made more highly dense, the spacing between dots that are formed in mutually adjacent positions results in an overlapping formation area thereof.

In a row of dots in which a plurality of dots are formed so as to overlap, when the next droplet lands before the previously landed ink droplet has completed permeation or before the ink droplet has finished curing, the ink droplet that landed afterward is drawn to the previously landed ink droplet, and it is possible that landing interference may occur in which a dot of the target size is not formed in the target dot formation position. Therefore, in order to inhibit such mutual interference (landing interference) between droplets when they land, droplet discharge is controlled so as to wait for the ink that previously landed to permeate and then discharge the ink droplet that will land next. However, it is difficult to achieve high-speed printing with droplet discharge control whereby the system waits for the ink that previously landed to permeate and then discharges the ink droplet that will land next.

The related art is more specifically described below with reference to FIGS. 13A to 15D.

FIGS. 13A and 13B are diagrams that describe the discharge control of the related art.

FIG. 13A shows a row 200 of dots formed on a recording paper using an inkjet recording apparatus. In the row 200 of dots, dots 202, 204, 206, and so forth having the same diameter D are aligned on the same line with the same pitch P between the dots.

In FIG. 13A, the pitch P between the dots is set to be less than the diameter D of the dots (that is to say, D>P), and the row 200 of dots is formed so that the adjacent dots are mutually overlapping.

FIG. 13B shows a line drawing 240 composed of the ink droplets which form the dots in the row 200 of dots shown in FIG. 13A, formed on the recording paper in which the ink droplets are discharged with a discharge cycle (discharge frequency) to an adjacent deposition point before the landed ink droplets completely permeate the recording paper. It should be noted that the key symbol 202' shown by the broken line 202 shows the intended (theoretical) shape of the line drawing 240 that was to be formed. Also, the discharge sequence of the ink droplets that form the row 200 of dots is the direction indicated by the arrow K (left to right direction in FIG. 13A).

As used herein, the term "dot" commonly refers to a substantially circular shape formed when an ink droplet discharged onto recording paper is fixed on the recording paper, and represents a substantially circular shape formed after the ink droplet has completed permeation. In the present specification, when the shape of the ink droplet breaks down and a shape that is different from a substantially circular shape is formed, or when a shape is formed that differs from a shape formed by the overlapping of a plurality of substantially circular shapes due to phenomena such as the grouping of a plurality of ink droplets, the shape formed by the deposition points is also referred to as a dot.

The present inkjet recording apparatus waits for a droplet discharge frequency at which ink droplets are discharged to an adjacent deposition point in at least one direction selected from the forward, rearward, leftward, and rightward directions before an ink droplet discharged to a certain deposition point has completely permeated the recording paper. For example, droplet discharge is carried out so that the ink that forms the dot 204 adjacent to the dot 202 lands on the recording paper before the ink droplet that forms the dot 202 completes permeation.

In this manner, when the ink droplet that forms a dot (dot 204) adjacent to a dot (dot 202) formed by the ink droplet is discharged before the ink droplet which has landed on the recording paper (ink droplet that forms dot 202, for example) completes permeation, the ink droplet that landed afterward connects with the previously landed ink droplet, and these become a single unit to form an image. This is a phenomenon that occurs when ink droplets are successively (same amounts) discharged, and due to aggregation immediately after the start of discharge the ink droplet that landed afterward is drawn to the previously landed ink droplet.

Originally, a line with a uniform (line width h=D) width should be formed when the ink droplets that form the row 200 of dots are successively discharged, but due to the above-described aggregation, a line drawing 240 in which the line width h=D' (that is to say, D'>D) is formed immediately after writing is started, as shown in FIG. 13B.

This is substantially equivalent to when a dot 202' with a diameter D' is formed by aggregation at the droplet deposition point at which the dot 202 with the intended diameter D is formed, and the line width of the line drawing 240 is actually nonuniform.

A more specific example is shown in FIGS. 14A to 14D and FIGS. 15A to 15C, which show line drawings 242 to 246 that are formed when two or more ink droplets are discharged with the following discharge conditions: an ink quantity of 2 pL per single discharge, a dot diameter D=30 µm when the dots are formed singly by the ink droplets, a pitch of P=10 μm between the dots, and a droplet discharge frequency that is 10% of the ink permeation time.

It should be noted that in FIGS. 14A to 14D and FIGS. 15A to 15D, the same key symbols are assigned to the same or similar portions as FIGS. 13A and 13B, and a description thereof is omitted.

FIG. 14A shows the case in which a single ink droplet is discharged to form a single dot 202. When a single ink droplet is discharged, a single dot is formed with a diameter of 30 μm.

FIG. 14B shows a line drawing 242 formed when five ink droplets have been successively discharged under the above-described conditions. It should be noted that the advancing direction of the droplet discharges is indicated by the arrow K and is the left-to-right direction in FIG. 14B.

When droplets are discharged so that the next ink droplet lands before the previously landed ink droplet completes permeation, as shown in FIG. 14B, the subsequently landed ink droplet is drawn to the previously landed ink droplet.

This situation is essentially the same as when an ink amount that is greater the prescribed 2 pL lands at the landing position of the previous ink droplet, and an ink amount that is less than the prescribed 2 pL lands at the landing position of the following ink droplet. The shape formed by these droplets is different from the shape formed by two dots with the same dot diameter that should be formed, a dot is formed with a diameter that is greater than the dot that was intended to be formed at the landing position of the previously landed ink droplet, a dot is also formed with a diameter that is less than the dot that was intended to be formed at the landing position of the following landed ink droplet, and the resulting shape is essentially the same as the shape of the two joined together.

In a similar manner, the third ink droplet is drawn to the ink droplet in which the first and second ink droplets have been joined together, and the phenomenon whereby the most recently landed ink droplet is drawn to the previously landed ink droplets. It should be noted that ratio (variation amount of ink) of recently landed ink droplets drawn to the previously landed ink droplets decreases as droplet discharge advances.

The ultimate shape of the line drawing 242 formed in this manner after the ink has completed permeation results in a state in which the width h1 (=40 μm) on first-droplet side (writing start side, left edge in FIG. 14B) is greater than the width hn (h5=20 μm in FIG. 14B) on the last-droplet side (writing end side). The density on the writing-start side is higher than the density on the writing-end side. This is due to the fact that the amount of droplet discharge on the writing start side (left side in FIG. 14B) is greater than that on the writing end side (right side in FIG. 14B) because the second droplet and later droplets are drawn to the liquid on the writing start side that landed previously.

It should be noted that the line width h1 of the edge of the writing start side is 40 μm, which is greater than the intended line width of 30 μm, and the line width h5 of the edge of the writing end side is 20 μm, which is less than the intended line width of 30 μm. The line width of the line drawing 242 gradually decreases from the writing start side toward the writing end side.

FIG. 14C shows a line drawing 244 formed when the 10 ink droplets are successively discharged under the above-described conditions, and FIG. 14D shows a line drawing 246 formed when the 60 ink droplets are successively discharged under the above-described conditions.

In the line drawing 244 formed with 10 ink droplets, the width h1 on the writing start side is 45 μm, and the width hn (h10 in FIG. 14C) on the writing end side is 20 μm, and since the width of the line drawing 244 gradually changes, the slope (when the width changes) is substantially fixed, as shown in FIG. 14C.

In the line drawing 246 formed with 60 ink droplets, the width h1 on the writing start side is 50 μm, and the width hn (h60 in FIG. 14D) on the writing end side is 15 μm, as shown in FIG. 14D. However, the slope of the width of the line drawing 246 shown in FIG. 14D is different depending on the writing start area 260, intermediate area 262, and writing end area 264.

In other words, in the writing start area 260, the width of the line drawing 246 gradually decreases from h1 (h1=50 μm in FIG. 14D) to hi (hi=30 μm in FIG. 14D); in the intermediate area 262, the width of the line drawing 246 does not vary from hi; and in the writing end area 264, the width of the line drawing 246 gradually decreases from hi to hn (h60=15 μm in FIG. 14C).

FIGS. 15A to 15D show the three-dimensional shape (cross-sectional shape) of the ink that forms the line drawings 242, 244, and 246 shown in FIGS. 14A to 14D.

In the line drawings 242 and 244 formed with about five to 10 droplets, as shown in FIGS. 15B and 15C, the height of the ink droplets gradually changes from the writing start side toward the writing end side.

Conversely, in the line drawing 246 shown in FIG. 15D, the height of the ink droplets gradually vary from the writing start side toward the writing end side in the writing start area 260 and writing end area 264, and the height of the ink droplets tend to remain unvaried in the intermediate area 262.

Therefore, when the ink droplet subsequently discharged before the previously landed ink droplet completes permeation lands so as to overlap the previously landed ink droplet, a phenomenon occurs whereby the width of the formed line drawing becomes nonuniform, and the quality of the resulting image is reduced due to landing interference that occurs on the recording paper, as shown in FIGS. 14A to 14D and FIGS. 15A to 15D. The phenomenon is difficult to observe as a difference in line thickness, but differences in line density are easily observed, and the phenomenon is particularly easily observed when a plurality of line drawings are formed next to each other.

It should be noted that the numerical values shown in FIGS. 13A and 13B as well as FIGS. 14A to 14D are merely examples, and the values may vary depending on the type of ink, type of recording paper (recording medium), and combinations thereof.

In the recording method and apparatus thereof cited in Japanese Patent Application Publication No. 9-272226, the configuration outputs the original recording data and interpolation data during separate head scans and carries out recording in order to prevent mutual interference of adjacent dots, and ink bleeding and mixing between the inks are prevented.

However, the discharge cycle cannot be reduced with control in which the subsequent ink lands after the previously landed ink droplet completes permeation. Also, since the permeation time of the ink (permeation velocity) varies depending on the combination of ink and recording medium, control must be carried out so as to vary the discharge cycle in accordance with the type of ink and recording medium that is to be used, and the control load of the apparatus is increased.

In the recording method and apparatus thereof cited in Japanese Patent Application Publication No. 9-272226, the original recording data scan and the interpolation data scan must be separately carried out when dots are formed with high density, a reduction in productivity is unavoidable, and it is difficult to achieve both higher image quality and higher printing speed.

SUMMARY OF THE INVENTION

The present invention has been contrived in view of such circumstances, and an object thereof is to provide a droplet discharge control method and droplet discharge apparatus wherein higher image quality and higher printing speed are ensured by controlling the droplet discharge with consideration for the landing interference of the droplets.

In order to attain the aforementioned object, the present invention is directed to a method of controlling droplet discharge for a liquid discharge apparatus which discharges droplets from a discharge head onto a discharge receiving medium, the method comprising the steps of: successively discharging a plurality of droplets from the discharge head so that at least some of the droplets discharged to mutually adjacent deposition points on a surface of the discharge receiving medium overlap; and carrying out at least one form of control selected from control which modifies a droplet discharge amount so that the droplet discharge amount of at least some of the droplets of the plurality of successively discharged droplets becomes relatively larger sequentially, and control which modifies flight velocity of the droplets so that the flight velocity of at least some of the droplets of the plurality of successively discharged droplets relatively increases sequentially.

According to the present invention, at least one form of control is carried out from among control which modifies the droplet discharge amount so that the droplet discharge amount of at least some of the droplets of a plurality of successively discharged droplets becomes relatively larger sequentially, and control which modifies the flight velocity of the droplets so that the flight velocity of at least some of the droplets of a plurality of successively discharged droplets relatively increases sequentially when droplets are successively discharged from the discharge head so that at least some of the droplets discharged to mutually adjacent deposition points on the surface of the discharge receiving medium overlap, making it possible to overcome the situation in which droplets discharged to mutually adjacent deposition points on the surface of the discharge receiving medium interfere and the dot diameters become nonuniform after the droplets have become fixed. It should be noted that of the shapes that are different from the intended substantially circular shape formed at the deposition points (dot formation points in the image data) and shapes formed when a plurality of droplets come together, the shapes of the fixed dots may include shapes that correspond to dots that were intended to be formed that are formed at the droplet deposition points.

Adjacent droplet deposition points may be adjacent in the width direction of the discharge receiving medium, in the direction substantially orthogonal to the width direction of the droplet discharge receiving medium, or in the diagonal direction that has components in the width direction of the discharge receiving medium and in the direction substantially orthogonal to the width direction of the droplet discharge receiving medium.

Successive droplet discharges may include an aspect in which a plurality of droplets are discharged with a droplet discharge cycle in which the next droplet lands before the previously landed ink droplet has completed permeation, and may include an aspect in which a plurality of droplets are discharged with a droplet discharge cycle (time until 10% of the entire amount of ejected ink permeates, for example) that is set based on the percentage of permeation time of the droplets.

In the aspect in which the droplet discharge amount relatively increases sequentially, the droplet discharge amount may be successively increased or the droplet discharge amount may be increased in a stepwise fashion every prescribed number of droplets.

The surface area that the droplets cover on the discharge receiving medium when the droplets land on the discharge receiving medium can be increased by increasing the droplet discharge amount or by increasing the flight velocity of the droplets.

The term "discharge head" includes a full-line head having discharge nozzles that discharge droplets aligned across a length corresponding to the entire width of the recording medium; a serial discharge head (shuttle-scan discharge head) in which the nozzle rows corresponding to the colors KCMY are aligned in the direction orthogonal to the direction corresponding to the entire width of the discharge receiving medium, in which the width of the head in the direction of the space between the rows of nozzles is made shorter than the length corresponding to the entire width of the recording medium, and in which the droplets are discharged as the head scans in the width direction of the discharged medium; and other types of heads.

A full-line discharge head may be one in which short heads having short rows of discharge holes that do not have a length corresponding to the entire width of the discharge receiving medium are arrayed and joined in a staggered formation in a length that corresponds to the entire width of the discharge receiving medium.

The discharge receiving medium includes continuous paper, cut paper, seal paper, and other types of paper; OHP sheets and other resin sheets; as well as film, cloth, metal, and various other media without regard to materials. The term "discharge receiving medium" includes media that is referred to as a recording target medium, recording medium, liquid-receiving medium, image formation medium, and the like.

In order to attain the aforementioned object, the present invention is also directed to a liquid discharge apparatus, comprising: a discharge head which discharges droplets onto a discharge receiving medium; and a control device which, when a plurality of droplets are successively discharged from the discharge head so that at least some of the droplets discharged to mutually adjacent deposition points on a surface of the discharge receiving medium overlap, carries out at least one form of control selected from control which modifies a droplet discharge amount so that the droplet discharge amount of at least some of the droplets of the plurality of successively discharged droplets becomes relatively larger sequentially, and control which modifies flight velocity of the droplets so that the flight velocity of at least some of the droplets of the plurality of successively discharged droplets relatively increases sequentially.

There is provided at least one device selected from a droplet discharge amount modification device for changing the droplet discharge amount of the droplets, and a flight velocity modification device for changing the flight velocity of the droplets.

Also possible is a configuration provided with a recording device in which the droplet discharge amount in the droplet discharges and the flight velocity of the droplets are converted into a data table, and the result is recorded when carrying out successive droplet discharges, and in which the droplet discharge amount of the droplets and the flight velocity of the droplets are read from the data table when carrying out successive droplet discharges.

Preferably, the control device carries out at least one form of control selected from control that modifies the droplet discharge amount so that the droplet discharge amount relatively increases sequentially, and control that modifies the flight velocity of the droplets so that the flight velocity of the droplets relatively increases sequentially in a writing start portion composed of a prescribed number of droplet discharges beginning with a first droplet discharge of the plurality of successively discharged droplets, controls the droplet discharge amount and the flight velocity so as to achieve a same droplet discharge amount and a same flight velocity in droplet discharges following the writing start portion, and makes uniform a diameter of a line drawing with a group of dots obtained by the successive droplet discharges.

In other words, considering the behavior of landing interference (aggregation) that occurs when droplets land on the discharge receiving medium so as to overlap with each other, at least one form of control selected from control that sequentially increases the droplet discharge amount and control that sequentially increases the flight velocity is carried out in the writing start portion for a prescribed number of droplet discharges beginning with the first droplet discharge of a plurality of successively discharged droplets, the droplet discharge amount and flight velocity are controlled so as to achieve the same droplet discharge amount and the same flight velocity in droplet discharges following the writing start portion, and the width of the line drawing can be made uniform across the entire length.

In the writing end portion beginning with the lasting a prescribed number of droplet discharges and the final droplet discharge, at least one form of control may be carried out selected from control that sequentially increases the droplet discharge amount and control that sequentially increases the flight velocity.

In the present invention, the writing start portion may include an interval beginning from the first droplet discharge and ending with a tenth droplet discharge.

The present droplet discharge control demonstrates a considerable effect in the writing areas. Also, the present droplet discharge control is preferably applied in the interval beginning from the droplet discharge tenth before the final droplet discharge and the final droplet discharge.

Preferably, the control device carries out droplet discharge control that causes droplets to be subsequently discharged to land on the recording medium at a timing at which a percentage of remaining droplet amount of a previously discharged droplet on the discharge receiving medium is 90% or higher with respect to the droplet discharge amount at the time of landing.

In a preferred aspect, the next droplet is discharged at a timing at which the remaining droplet amount of the previously discharge droplet on the discharge receiving medium is substantially the same as the droplet amount at the time of landing.

Preferably, the control device modifies at least one of a percentage in which the droplet discharge amount of the droplets to be subsequently discharged is made relatively larger than that of the previously discharged droplet, and a percentage in which the flight velocity of the droplet to be subsequently discharged is made relatively greater than that of the previously discharged droplet in accordance with at least one parameter selected from an amount of overlap of the previously discharged droplet and the droplet to be subsequently discharged on the discharge receiving medium, and a surface tension that operates between the previously discharged droplet and the droplet to be subsequently discharged.

In other words, the greater the surface tension with which two droplets in contact pull on each other, the more reliably the dot diameter of the dots formed after being fixed can be made uniform by carrying out one form of control selected from control that increases the droplet amount of the droplet to be subsequently discharged and control that increases the flight velocity of the droplet to be subsequently discharged.

Preferably, the control device carries out control that makes the droplet discharge amount of a first droplet discharge less than an originally intended droplet discharge amount.

In other words, the droplet discharged first interferes with the subsequently discharged droplet, the amount of liquid increases over the amount of liquid actually discharged, and a dot is formed that is larger than the dot that was intended to be formed on the deposition point at which the droplet has landed due to the previously landed droplet. Therefore, in anticipation of such a situation, a dot with a size that was intended to be formed is formed at the landing position established by the first droplet because the discharge amount of the first droplet is set in advance to be a lesser amount.

The actual droplet discharge amount may be made less than the originally intended discharge amount in the interval of time beginning with the first droplet discharge and ending after a prescribed number of droplet has been discharged.

In accordance with the present invention, when droplets are successively discharged so that the droplets that have landed on the discharge receiving medium overlap with each other, the nonuniformity of the diameter of the droplets after the droplets have become fixed can be overcome by carrying out at least one form of control selected from control that increases the droplet discharge amount of the droplet to be subsequently discharged to an amount greater than the droplet discharge amount of the previously discharged droplet, and control that increases the flight velocity of the droplet to be subsequently discharged to a velocity that is greater than the flight velocity of the previously discharged droplet.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 2 is a plan view of principal components of an area around a printing unit of the inkjet recording apparatus in FIG. 1;

FIG. 3C is a perspective plan view showing another example of the configuration of the print head;

DETAILED DESCRIPTION OF THE PREFERRED EMBODIMENTS

General Configuration of an Inkjet Recording Apparatus

Figure 1:
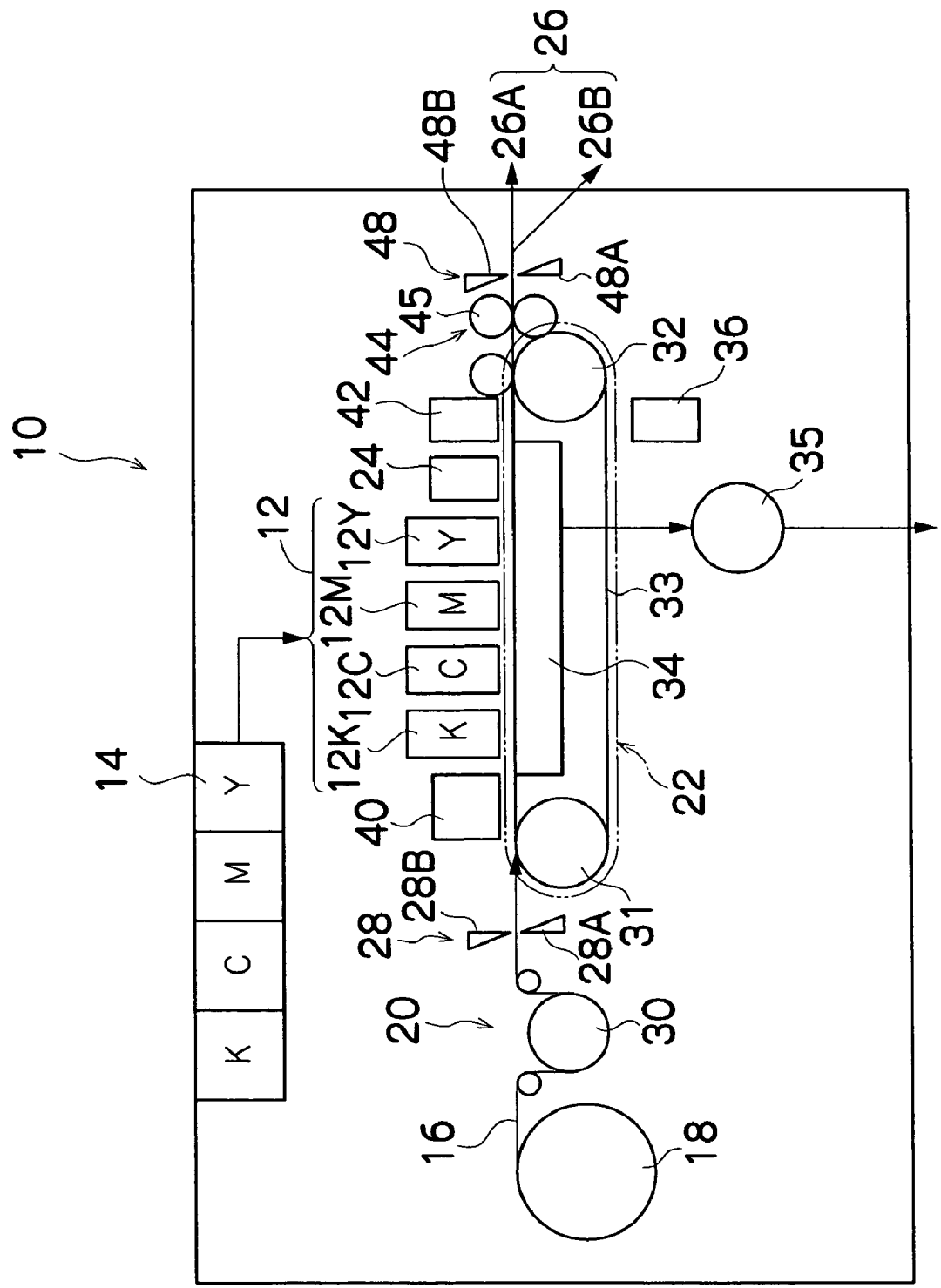
FIG. 1 is a general schematic drawing of an inkjet recording apparatus according to an embodiment of the present invention.

FIG. 1 is a general schematic drawing of an inkjet recording apparatus according to an embodiment of the present invention. As shown in FIG. 1, the inkjet recording apparatus 10 comprises: a printing unit 12 having a plurality of print heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet discharge face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a single magazine for rolled paper (continuous paper) is shown as an example of the paper supply unit 18; however, a plurality of magazines with paper differences such as paper width and quality may be jointly provided. Moreover, paper may be supplied with a cassette that contains cut paper loaded in layers and that is used jointly or in lieu of a magazine for rolled paper.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

In the case of the configuration in which roll paper is used, a cutter (first cutter) 28 is provided as shown in FIG. 1, and the continuous paper is cut into a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyor pathway. When cut paper is used, the cutter 28 is not required.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1; and the suction chamber 34 provides suction with a fan 35 to generate a negative pressure, and the recording paper 16 is held on the belt 33 by suction.

The belt 33 is driven in the clockwise direction in FIG. 1 by the motive force of a motor (not shown in FIG. 1, but shown as a motor 88 in FIG. 7) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, examples thereof include a configuration in which the belt 33 is nipped with a cleaning roller such as a brush roller and a water absorbent roller, an air blow configuration in which clean air is blown onto the belt 33, or a combination of these. In the case of the configuration in which the belt 33 is nipped with the cleaning roller, it is preferable to make the line velocity of the cleaning roller different than that of the belt 33 to improve the cleaning effect.

The inkjet recording apparatus 10 can comprise a roller nip conveyance mechanism, in which the recording paper 16 is pinched and conveyed with nip rollers, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

As shown in FIG. 2, the printing unit 12 forms a so-called full-line head in which a line head having a length that corresponds to the maximum paper width is disposed in the main scanning direction perpendicular to the delivering direction of the recording paper 16 (hereinafter referred to as the paper conveyance direction) represented by the arrow in FIG. 2, which is substantially perpendicular to a width direction of the recording paper 16. A specific structural example is described later with reference to FIGS. 3A to 5. Each of the print heads 12K, 12C, 12M, and 12Y is composed of a line head, in which a plurality of ink-droplet ejection apertures (nozzles) are arranged along a length that exceeds at least one side of the maximum-size recording paper 16 intended for use in the inkjet recording apparatus 10, as shown in FIG. 2.

The print heads 12K, 12C, 12M, and 12Y are arranged in this order from the upstream side along the paper conveyance direction. A color print can be formed on the recording paper 16 by ejecting the inks from the print heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the sub-scanning direction just once (i.e., with a single sub-scan). Higher-speed printing is thereby made possible and productivity can be improved in comparison with a shuttle type head configuration in which a print head reciprocates in the main scanning direction.

Although the configuration with the KCMY four standard colors is described in the present embodiment, combinations of the ink colors and the number of colors are not limited to those, and light and/or dark inks can be added as required. For example, a configuration is possible in which print heads for ejecting light-colored inks such as light cyan and light magenta are added.

As shown in FIG. 1, the ink storing and loading unit 14 has tanks for storing the inks of K, C, M and Y to be supplied to the print heads 12K, 12C, 12M, and 12Y, and the tanks are connected to the print heads 12K, 12C, 12M, and 12Y through channels (not shown), respectively. The ink storing and loading unit 14 has a warning device (e.g., a display device, an alarm sound generator) for warning when the remaining amount of any ink is low, and has a mechanism for preventing loading errors among the colors.

The print determination unit 24 has an image sensor for capturing an image of the ink-droplet deposition result of the print unit 12, and functions as a device to check for ejection defects such as clogs of the nozzles in the print unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the print heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern printed with the print heads 12K, 12C, 12M, and 12Y for the respective colors, and the ejection of each head is determined. The ejection determination includes the presence of the ejection, measurement of the dot size, and measurement of the dot deposition position. The details of the ejection determination are described later.

The post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

The heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathway in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in FIG. 1, the paper output unit 26A for the target prints is provided with a sorter for collecting prints according to print orders.

Next, the structure of the print heads is described. The print heads 12K, 12C, 12M and 12Y have the same structure, and a reference numeral 50 is hereinafter designated to any of the print heads 12K, 12C, 12M and 12Y.

Figure 3A:
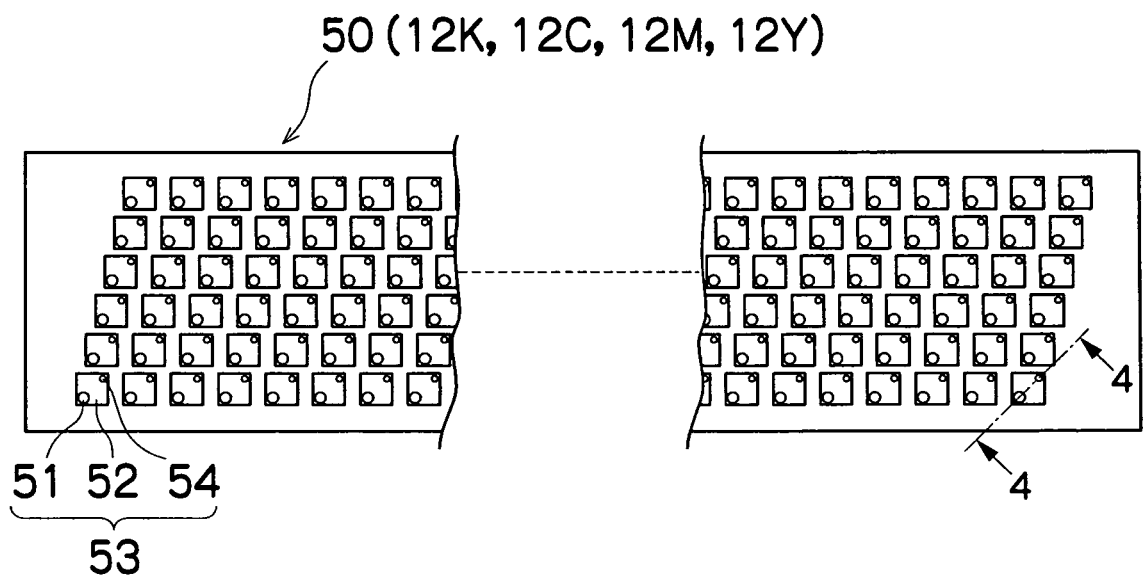
FIG. 3A is a perspective plan view showing an example of a configuration of a print head.
Figure 3B:
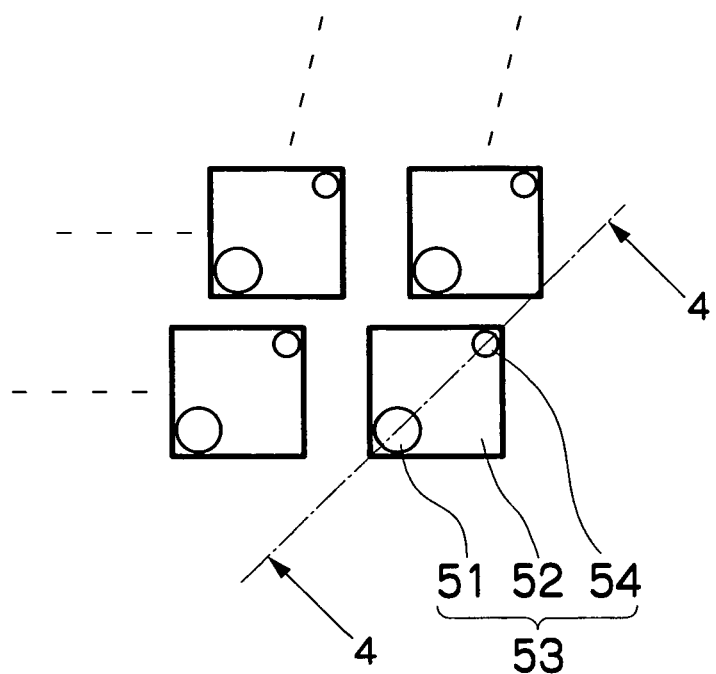
FIG. 3B is a partial enlarged view of FIG. 3A.
Figure 4:
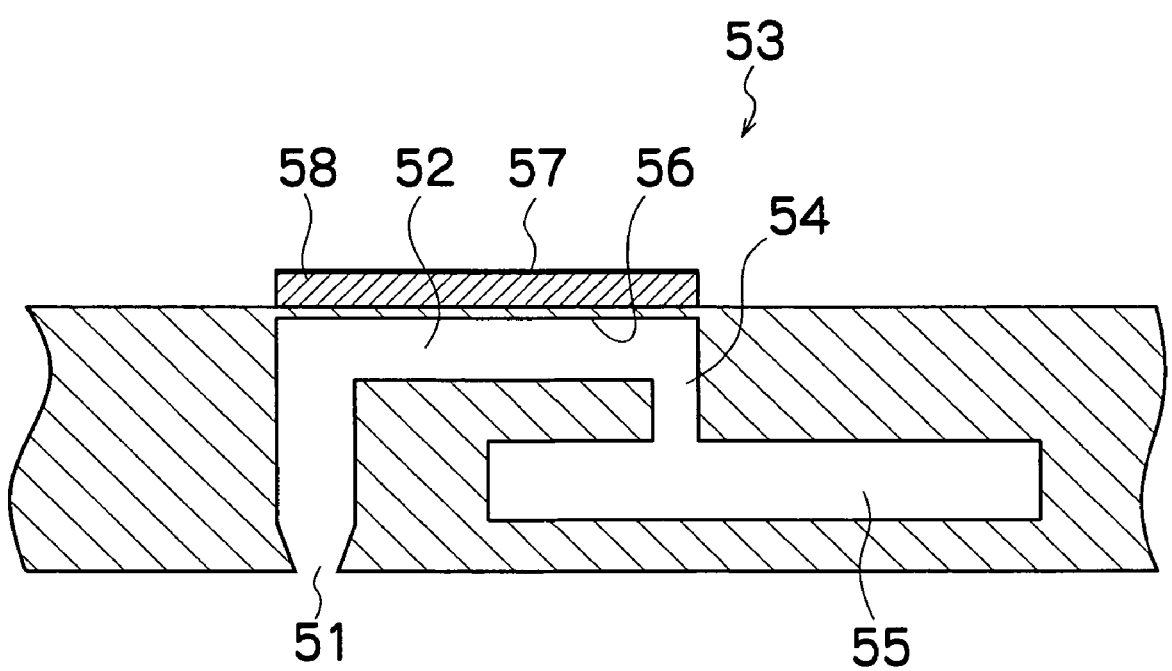
FIG. 4 is a cross-sectional view along a line 4-4 in FIGS. 3A and 3B.

FIG. 3A is a perspective plan view showing an example of the configuration of the print head 50, FIG. 3B is an enlarged view of a portion thereof, FIG. 3C is a perspective plan view showing another example of the configuration of the print head, and FIG. 4 is a cross-sectional view taken along the line 4-4 in FIGS. 3A and 3B, showing the inner structure of an ink chamber unit.

The nozzle pitch in the print head 50 should be minimized in order to maximize the density of the dots printed on the surface of the recording paper. As shown in FIGS. 3A, 3B, 3C and 4, the print head 50 in the present embodiment has a structure in which a plurality of ink chamber units 53 including nozzles 51 for ejecting ink-droplets and pressure chambers 52 connecting to the nozzles 51 are disposed in the form of a staggered matrix, and the effective nozzle pitch is thereby made small.

Thus, as shown in FIGS. 3A and 3B, the print head 50 in the present embodiment is a full-line head in which one or more of nozzle rows in which the ink discharging nozzles 51 are arranged along a length corresponding to the entire width of the recording medium in the direction substantially perpendicular to the conveyance direction of the recording medium.

Alternatively, as shown in FIG. 3C, a full-line head can be composed of a plurality of short two-dimensionally arrayed head units 50' arranged in the form of a staggered matrix and combined so as to form nozzle rows having lengths that correspond to the entire width of the recording paper 16.

The planar shape of the pressure chamber 52 provided for each nozzle 51 is substantially a square, and the nozzle 51 and an inlet of supplied ink (supply port) 54 are disposed in both corners on a diagonal line of the square. Each pressure chamber 52 is connected to a common channel 55 through the supply port 54.

An actuator 58 having a discrete electrode 57 is joined to a pressure plate 56, which forms the ceiling of the pressure chamber 52, and the actuator 58 is deformed by applying drive voltage to the discrete electrode 57 to eject ink from the nozzle 51. When ink is ejected, new ink is delivered from the common channel 55 through the supply port 54 to the pressure chamber 52.

Figure 5:
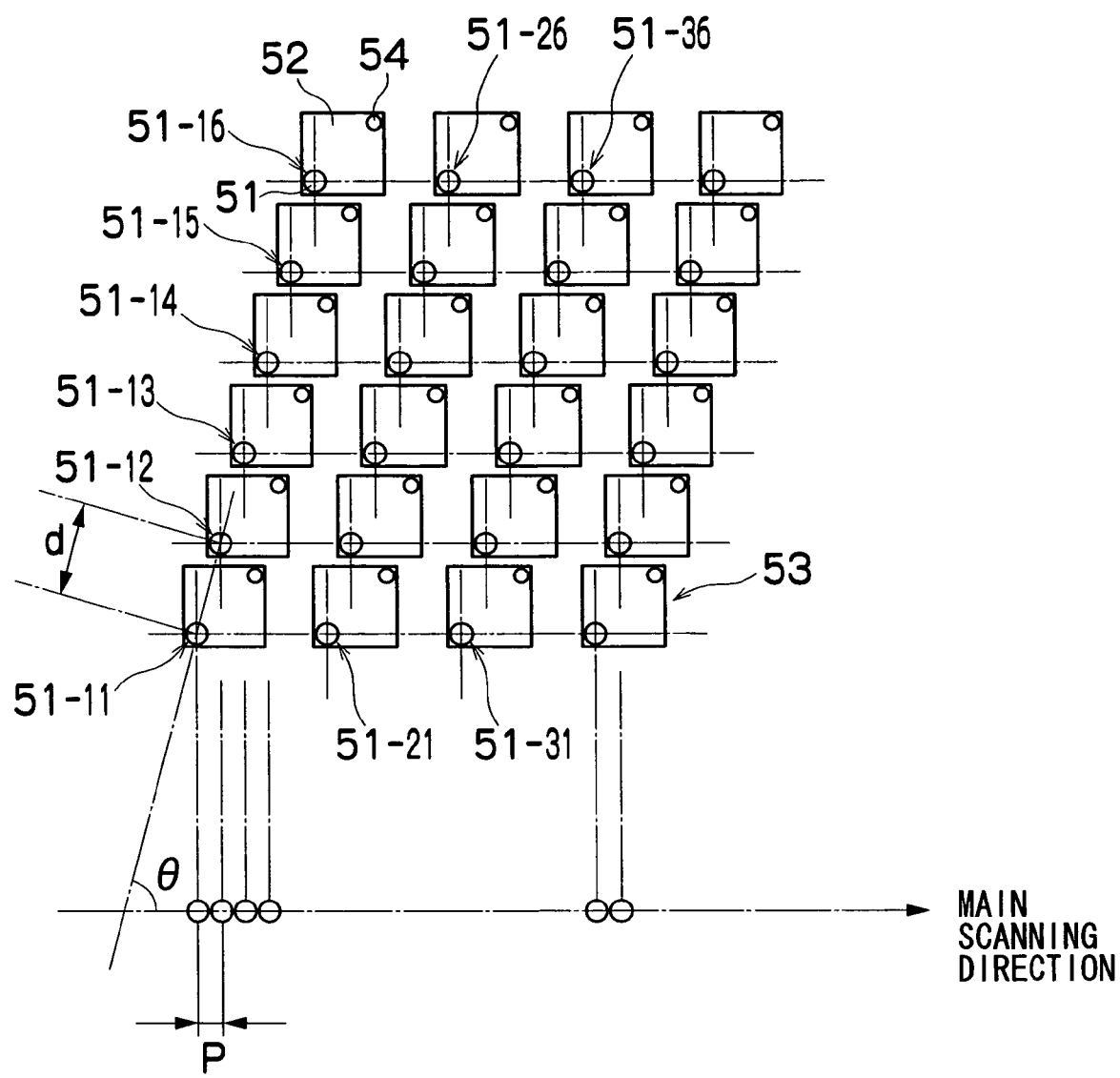
FIG. 5 is an enlarged view showing nozzle arrangement of the print head in FIG. 3A.

The plurality of ink chamber units 53 having such a structure are arranged in a grid with a fixed pattern in the line-printing direction along the main scanning direction and in the diagonal-row direction forming a fixed angle θ that is not a right angle with the main scanning direction, as shown in FIG. 5. With the structure in which the plurality of rows of ink chamber units 53 are arranged at a fixed pitch d in the direction at the angle θ with respect to the main scanning direction, the nozzle pitch P as projected in the main scanning direction is d×cos θ.

Hence, the nozzles 51 can be regarded to be equivalent to those arranged at a fixed pitch P on a straight line along the main scanning direction. Such configuration results in a nozzle structure in which the nozzle row projected in the main scanning direction has a high nozzle density of up to 2,400 nozzles per inch (npi).

In a full-line head comprising rows of nozzles that have a length corresponding to the entire width of the paper (the recording paper 16), the "main scanning" is defined as to print one line (a line formed of a row of dots, or a line formed of a plurality of rows of dots) in the width direction of the recording paper (the direction perpendicular to the delivering direction of the recording paper) by driving the nozzles in one of the following ways: (1) simultaneously driving all the nozzles; (2) sequentially driving the nozzles from one side toward the other; and (3) dividing the nozzles into blocks and sequentially driving the blocks of the nozzles from one side toward the other.

In particular, when the nozzles 51 arranged in a matrix such as that shown in FIG. 5 are driven, the main scanning according to the above-described (3) is preferred. More specifically, the nozzles 51-11, 51-12, 51-13, 51-14, 51-15 and 51-16 are treated as a block (additionally; the nozzles 51-21, 51-22, ..., 51-26 are treated as another block; the nozzles 51-31, 51-32, ..., 51-36 are treated as another block, ...); and one line is printed in the width direction of the recording paper 16 by sequentially driving the nozzles 51-11, 51-12, ..., 51-16 in accordance with the conveyance velocity of the recording paper 16.

On the other hand, the "sub-scanning" is defined as to repeatedly perform printing of one line (a line formed of a row of dots, or a line formed of a plurality of rows of dots) formed by the main scanning, while moving the full-line head and the recording paper relatively to each other.

Incidentally, the present embodiment is described with respect to a full-line print head, but the application scope of the present invention is not limited to the full-line print head and it may also be applied to a shuttle type print head in which one line is formed in a main scanning direction while the print head is scanned in the main scanning direction.

Moreover, arrangement configuration of the nozzles is not limited to the example shown in the drawings, and a print head having one nozzle row in the main scanning direction may be adopted.

In implementing the present invention, the arrangement of the nozzles is not limited to that of the example illustrated. Moreover, a method is employed in the present embodiment where an ink droplet is ejected by means of the deformation of the actuator 58, which is typically a piezoelectric element; however, in implementing the present invention, the method used for discharging ink is not limited in particular, and instead of the piezo jet method, it is also possible to apply various types of methods, such as a thermal jet method where the ink is heated and bubbles are caused to form therein by means of a heat generating body such as a heater, ink droplets being ejected by means of the pressure of these bubbles.

Figure 6:
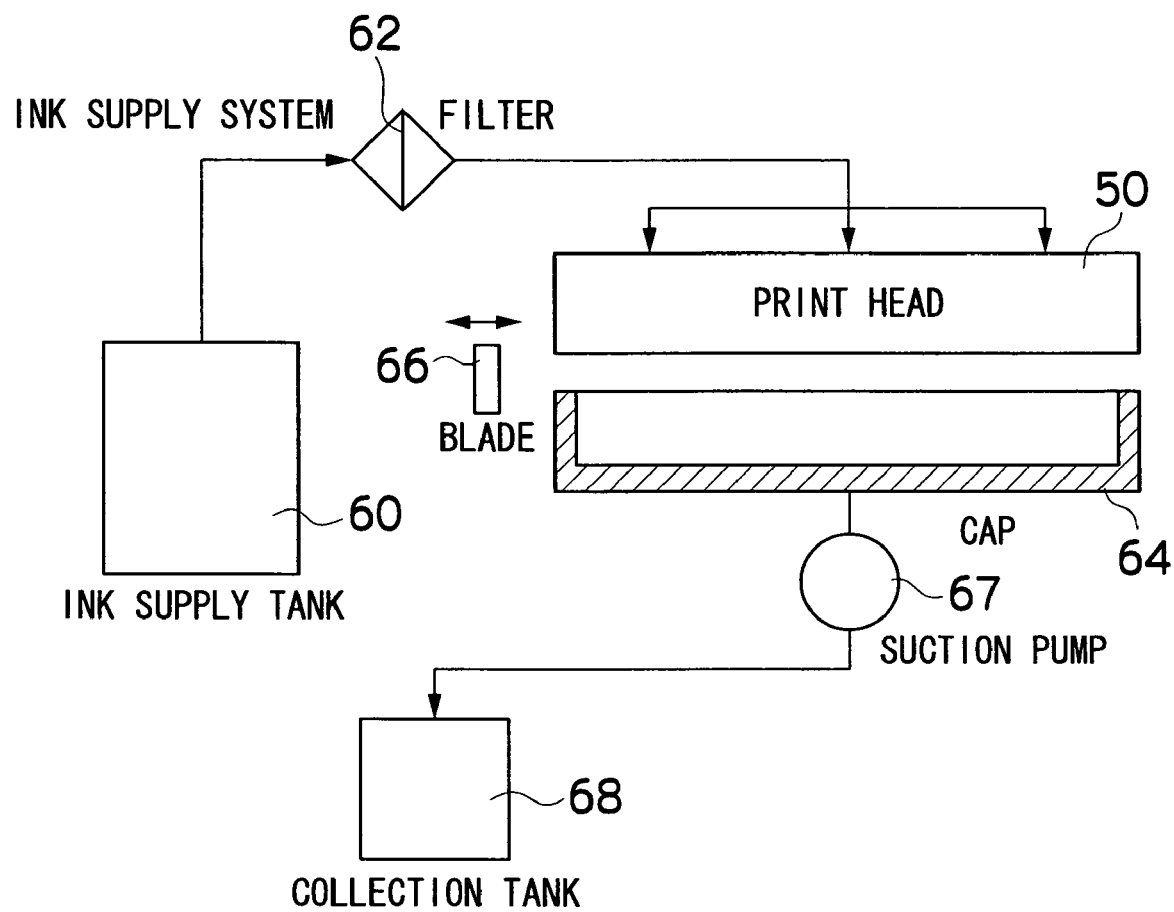
FIG. 6 is a schematic drawing showing a configuration of an ink supply system in the inkjet recording apparatus.

FIG. 6 is a schematic drawing showing the configuration of the ink supply system in the inkjet recording apparatus 10.

An ink supply tank 60 is a base tank that supplies ink and is set in the ink storing and loading unit 14 described with reference to FIG. 1. The aspects of the ink supply tank 60 include a refillable type and a cartridge type: when the remaining amount of ink is low, the ink supply tank 60 of the refillable type is filled with ink through a filling port (not shown) and the ink supply tank 60 of the cartridge type is replaced with a new one. In order to change the ink type in accordance with the intended application, the cartridge type is suitable, and it is preferable to represent the ink type information with a bar code or the like on the cartridge, and to perform ejection control in accordance with the ink type. The ink supply tank 60 in FIG. 6 is equivalent to the ink storing and loading unit 14 in FIG. 1 described above.

A filter 62 for removing foreign matters and bubbles is disposed between the ink supply tank 60 and the print head 50 as shown in FIG. 6. The filter mesh size in the filter 62 is preferably equivalent to or less than the diameter of the nozzle and commonly about 20 μm.

Although not shown in FIG. 6, it is preferable to provide a sub-tank integrally to the print head 50 or nearby the print head 50. The sub-tank has a damper function for preventing variation in the internal pressure of the head and a function for improving refilling of the print head.

The inkjet recording apparatus 10 is also provided with a cap 64 as a device to prevent the nozzles 51 from drying out or to prevent an increase in the ink viscosity in the vicinity of the nozzles 51, and a cleaning blade 66 as a device to clean the nozzle face.

A maintenance unit including the cap 64 and the cleaning blade 66 can be moved relatively with respect to the print head 50 by a movement mechanism (not shown), and is moved from a predetermined holding position to a maintenance position below the print head 50 as required.

The cap 64 is displaced up and down relatively with respect to the print head 50 by an elevator mechanism (not shown). When the power of the inkjet recording apparatus 10 is switched OFF or when in a print standby state, the cap 64 is raised to a predetermined elevated position so as to come into close contact with the print head 50, and the nozzle face is thereby covered with the cap 64.

The cleaning blade 66 is composed of rubber or another elastic member, and can slide on the ink discharge surface (surface of the nozzle plate) of the print head 50 by means of a blade movement mechanism (not shown). When ink droplets or foreign matter has adhered to the nozzle plate, the surface of the nozzle plate is wiped, and the surface of the nozzle plate is cleaned by sliding the cleaning blade 66 on the nozzle plate.

During printing or standby, when the frequency of use of specific nozzles is reduced and ink viscosity increases in the vicinity of the nozzles, a preliminary discharge is made toward the cap 64 to discharge the degraded ink.

Also, when bubbles have become intermixed in the ink inside the print head 50 (inside the pressure chamber 52), the cap 64 is placed on the print head 50, ink (ink in which bubbles have become intermixed) inside the pressure chamber is removed by suction with a suction pump 67, and the suction-removed ink is sent to a collection tank 68. This suction action entails the suctioning of degraded ink whose viscosity has increased (hardened) when initially loaded into the head, or when service has started after a long period of being stopped.

When a state in which ink is not discharged from the print head 50 continues for a certain amount of time or longer, the ink solvent in the vicinity of the nozzles 51 evaporates and ink viscosity increases. In such a state, ink can no longer be discharged from the nozzle 51 even if the actuator 58 is operated. Before reaching such a state the actuator 58 is operated (in a viscosity range that allows discharge by the operation of the actuator 58), and the preliminary discharge is made toward the ink receptor to which the ink whose viscosity has increased in the vicinity of the nozzle is to be discharged. After the nozzle surface is cleaned by a wiper such as the cleaning blade 66 provided as the cleaning device for the nozzle face, a preliminary discharge is also carried out in order to prevent the foreign matter from becoming mixed inside the nozzles 51 by the wiper sliding operation. The preliminary discharge is also referred to as "dummy discharge," "purge", "liquid discharge," and so on.

When bubbles have become intermixed in the nozzle 51 or the pressure chamber 52, or when the ink viscosity inside the nozzle 51 has increased over a certain level, ink can no longer be discharged by the preliminary discharge, and a suctioning action is carried out as follows.

More specifically, when bubbles have become intermixed in the ink inside the nozzle 51 and the pressure chamber 52, ink can no longer be discharged from the nozzles even if the actuator 58 is operated. Also, when the ink viscosity inside the nozzle 51 has increased over a certain level, ink can no longer be discharged from the nozzle 51 even if the actuator 58 is operated. In these cases, a suctioning device to remove the ink inside the pressure chamber 52 by suction with a suction pump, or the like, is placed on the nozzle face of the print head 50, and the ink in which bubbles have become intermixed or the ink whose viscosity has increased is removed by suction.

However, this suction action is performed with respect to all the ink in the pressure chamber 52, so that the amount of ink consumption is considerable. Therefore, a preferred aspect is one in which a preliminary discharge is performed when the increase in the viscosity of the ink is small.

Figure 7:
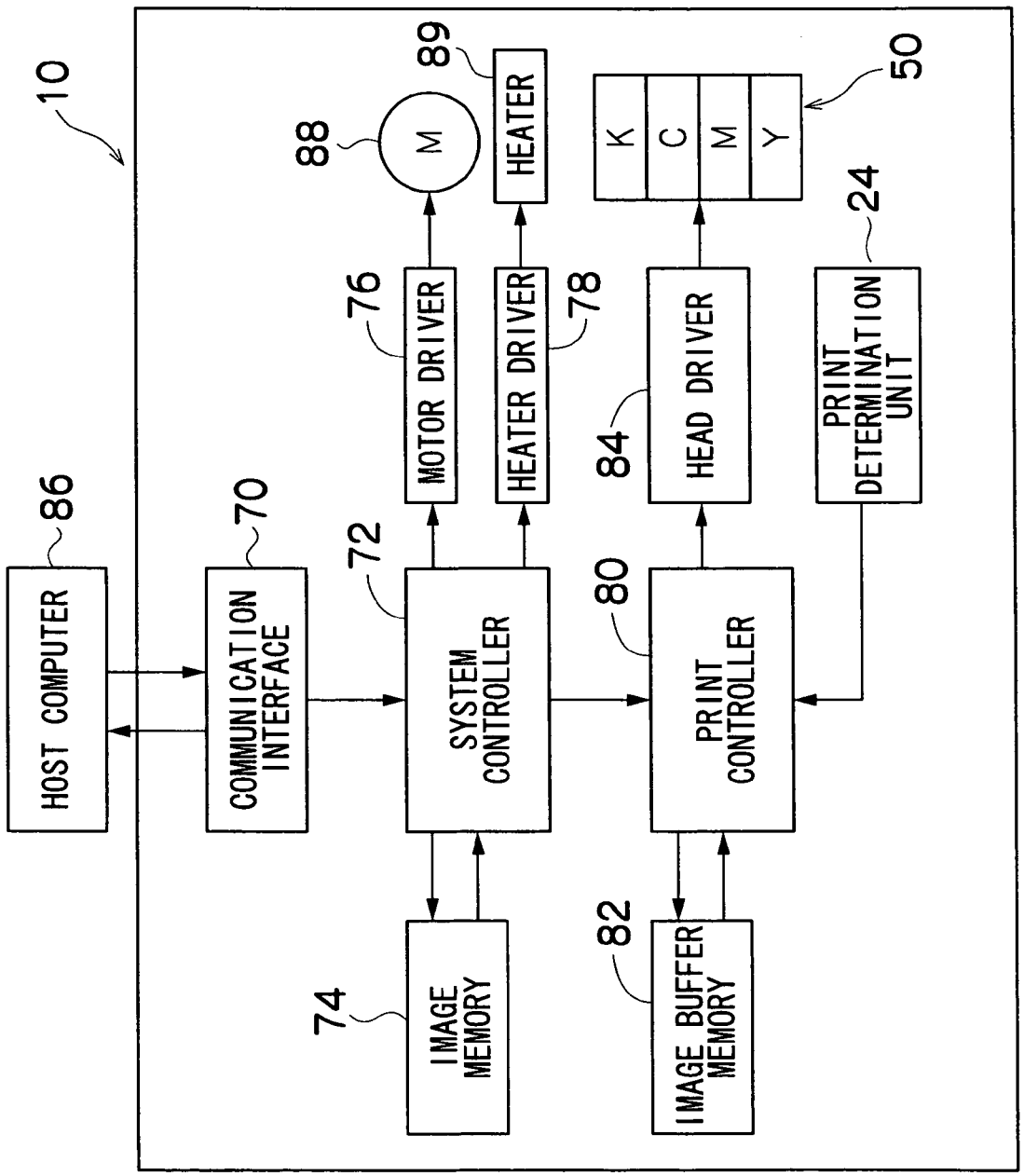
FIG. 7 is a principal block diagram showing the system composition of the inkjet recording apparatus.

FIG. 7 is a block diagram of the principal components showing the system configuration of the inkjet recording apparatus 10. The inkjet recording apparatus 10 has a communication interface 70, a system controller 72, an image memory 74, a motor driver 76, a heater driver 78, a print controller 80, an image buffer memory 82, a head driver 84, and other components.

The communication interface 70 is an interface unit for receiving image data sent from a host computer 86. A serial interface such as USB, IEEE1394, Ethernet, wireless network, or a parallel interface such as a Centronics interface may be used as the communication interface 70. A buffer memory (not shown) may be mounted in this portion in order to increase the communication speed. The image data sent from the host computer 86 is received by the inkjet recording apparatus 10 through the communication interface 70, and is temporarily stored in the image memory 74. The image memory 74 is a storage device for temporarily storing images inputted through the communication interface 70, and data is written and read to and from the image memory 74 through the system controller 72. The image memory 74 is not limited to memory composed of a semiconductor element, and a hard disk drive or another magnetic medium may be used.

The system controller 72 controls the communication interface 70, image memory 74, motor driver 76, heater driver 78, and other components. The system controller 72 has a central processing unit (CPU), peripheral circuits therefor, and the like. The system controller 72 controls communication between itself and the host computer 86, controls reading and writing from and to the image memory 74, and performs other functions, and also generates control signals for controlling a heater 89 and the motor 88 in the conveyance system.

The motor driver (drive circuit) 76 drives the motor 88 in accordance with commands from the system controller 72. The heater driver (drive circuit) 78 drives the heater 89 of the post-drying unit 42 or the like in accordance with commands from the system controller 72.

The print controller 80 has a signal processing function for performing various tasks, compensations, and other types of processing for generating print control signals from the image data stored in the image memory 74 in accordance with commands from the system controller 72 so as to apply the generated print control signals (image formation data) to the head driver 84. The print control unit 80 is a control unit having a signal processing function for performing various treatment processes, corrections, and the like, in accordance with the control implemented by the system controller 72, in order to generate a signal for controlling printing, from the image data in the image memory 74, and it supplies the print control signal (image data) thus generated to the head driver 84. Prescribed signal processing is carried out in the print control unit 80, and the discharge amount and the discharge timing of the ink droplets from the respective print heads 50 are controlled via the head driver 84, on the basis of the image data. By this means, prescribed dot size and dot positions can be achieved.

The print controller 80 is provided with the image buffer memory 82; and image data, parameters, and other data are temporarily stored in the image buffer memory 82 when image data is processed in the print controller 80. The aspect shown in FIG. 7 is one in which the image buffer memory 82 accompanies the print controller 80; however, the image memory 74 may also serve as the image buffer memory 82. Also possible is an aspect in which the print controller 80 and the system controller 72 are integrated to form a single processor. The head driver 84 drives the actuators 58 for the print heads 12K, 12C, 12M and 12Y of the respective colors on the basis of the print data received from the print controller 80. A feedback control system for keeping the drive conditions for the print heads constant may be included in the head driver 84.

Control programs are stored in the program storage unit (not shown), and a control program is read and executed in accordance with a command of the system controller 72. The program storage unit may use ROM, EEPROM, or another semiconductor memory, or a magnetic disk may be used. An external interface may be provided, and a memory card or a PC card may be used. A plurality of these recording media may naturally be used.

It should be noted that the program storage unit may double as a recording device (not shown) for operation parameters or the like.

The print determination unit 24 is a block that includes a line sensor, as described in FIG. 1. The unit reads the image printed on the recording paper 16, carries out required signal processing to detect the printing state (presence of discharge, variability is droplet discharge, and other factors), and presents the detection results thereof to the print controller 80.

The print controller 80 makes various corrections to the print head 50 on the basis of the information obtained from the print determination unit 24 as required.

It should be noted that the example shown in FIG. 1 has a configuration in which the print determination unit 24 is provided to the print surface side, the print surface is illuminated by a cold-cathode tube or another light source (not shown) disposed nearby the line sensor, and the reflected light thereof is read by the line sensor, but other configurations may used in the implementation of the present invention.

First Embodiment

Next, the droplet discharge control of the inkjet recording apparatus 10 of the first embodiment of the present invention is described.

In the present inkjet recording apparatus 10, when forming a line drawing with ink droplets successively discharged in a short interval of time (when the subsequent ink droplet lands in the interval of time in which 10% of the previously landed ink droplet permeates the recording paper 16, for example, or in other situations), droplet discharge control is carried out so that the line width h is substantially uniform across the entire length of the line drawing even if the landing interference (aggregation) cited in the related art is generated.

Aggregation depends on the size relationship of the subsequently landed ink droplet and the previously landed ink droplet on the surface of the recording paper 16 at the instant that the subsequent ink droplet lands. Even if the amount (ejection volume) of the previously landed ink droplet and the subsequently landed ink droplet is the same, when the previously landed ink droplet and the subsequently landed ink droplet are discharged so as to overlap on the surface of the recording paper 16, the instant the subsequently discharged ink droplet lands it is drawn to the previously discharged ink droplet, the droplet diameter of the previously discharged droplet increases, and the droplet diameter of the droplet to be subsequently discharged becomes less than the droplet diameter than if it had landed in isolation.

The slope of the line drawings 240 to 246 shown in FIGS. 13A and 13B, and FIGS. 14A to 14D tends to increase as it approaches the dot pitch P (droplet discharge interval), and when the permeation amount of the ink droplet is small (that is to say, when the amount of non-permeated ink remaining on the surface of the recording paper 16 is large), the slope tends to increase.

In the present droplet discharge control, when the previously landed ink droplet and subsequently landed ink droplet are discharged so as to overlap on the recording paper 16, the amount of the subsequently landed ink droplet is controlled to be greater than the amount of the previously landed ink droplet so that the diameter of the previously landed ink droplet and the diameter of the subsequently landed ink droplet are substantially the same. Also, the percentage by which the droplet to be subsequently discharged is made larger is determined in accordance with the dot pitch, the amount of non-permeated ink, the surface tension of the ink, and other factors.

Since the permeation velocity of the ink depends on the type of ink and the type of recording paper 16 (recording medium), the information regarding the permeation time of the ink can be prerecorded for each type of ink and each type of recording paper 16 when determining the percentage by which the droplet discharge amount is to be increased in accordance with the amount of non-permeated ink.

As used herein, the term "ink droplet diameter" signifies the diameter of the substantially circular shape formed when the ink droplet in a non-permeated state remaining on the surface is projected to the surface of the recording paper 16 (recording medium) without permeating the recording paper 16. This corresponds to the size of the area occupied by the ink droplet in a non-permeated state on the recording paper 16.

In other words, when the ink droplet lands on the recording medium (recording paper 16 in this case), the ink droplet gradually continues to spread over the recording medium for a fixed period of time immediately after landing, the amount of non-permeation of the ink droplet decreases in accordance with the progress of the permeation of the ink droplet into the recording medium after a prescribed amount of time elapses after landing, and the droplet diameter on the surface of the recording medium gradually decreases. Since the non-permeation amount of the ink droplet reaches zero when the permeation of the ink droplet is complete, the ink droplet diameter is zero.

Figure 8A:
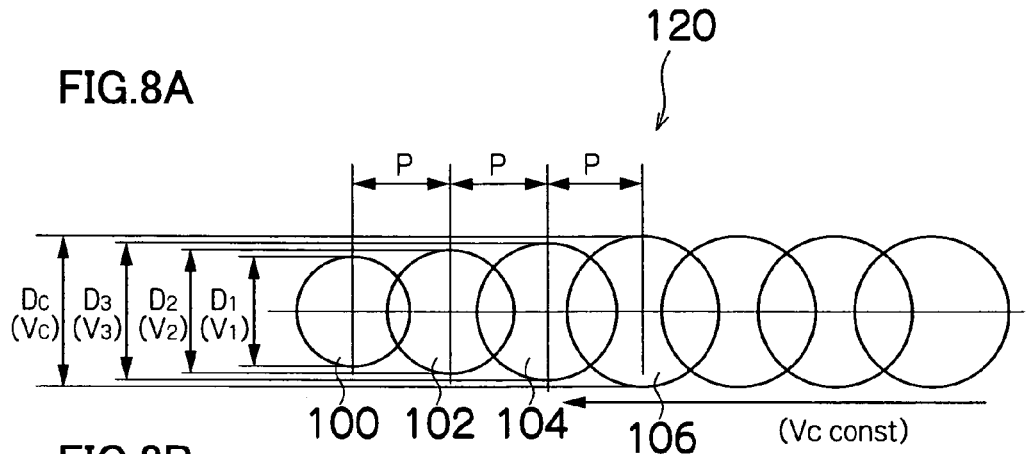
FIGS. 8A to 8C are diagrams describing the discharge control of the first embodiment of the present invention.
Figure 8B:
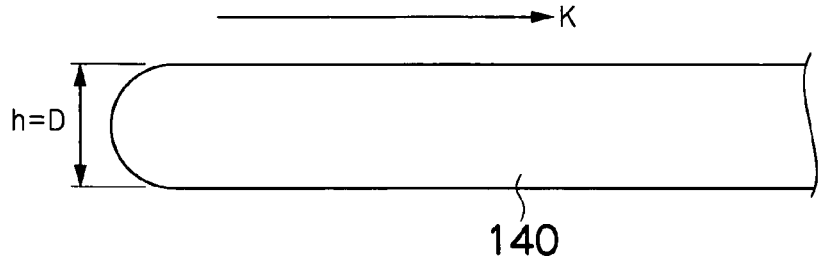

FIG. 8A shows a row 120 of dots that includes the dots 100, 102, 104, 106, and so forth aligned at equal intervals at a dot pitch P, and FIG. 8B shows the line drawing 140 with a line width of h=D formed when ink droplets that form the row 120 of dots shown in FIG. 8A are successively discharged in the direction (left-to-right direction in FIGS. 8A to 8C) indicated by the arrow K at a droplet discharge interval determined by the time required for 10% of the ink droplet to permeate the paper. The row 120 of dots shows the case in which the dots are formed without landing interference or the like between the dots (that is to say, the row of dots that contains ideally formed dots).

In other words, in the present droplet discharge control, droplets are discharged with a time interval that extends until the remaining droplet amount in a non-permeated state is 90% (0.9) of the droplet amount at the time the droplet landed, and when the first ink droplet (ink droplet that forms the dot 100 in FIG. 8A) lands before the second ink droplet (ink droplet that forms the dot 102 in FIG. 8A) lands, droplet discharge is controlled so as to modify the droplet discharge amount of at least the first droplet or the second droplet so that the diameter the instant the second ink droplet lands is substantially the same as the ink diameter of the first ink droplet.

In the aspect shown in FIG. 8A, the dot 100 is formed by the first ink droplet, the dot 102 is formed by the second ink droplet, the dot 104 is formed by the third ink droplet, and the dot 106 is formed by the fourth ink droplet. Thereafter, the ink droplets are sequentially discharged with a prescribed discharge cycle, and the line drawing 140 shown in FIG. 8B is formed.

Assuming that the discharge amount of the first droplet is v1, the discharge amount of the second droplet is v2, the discharge amount of the third droplet is v3, the discharge amount of the fourth droplet is vc, and so forth, the discharge amount of the ink droplet is controlled in the present droplet discharge control so that v1<v2<v3<vc.

It should be noted that in the aspect shown in FIG. 8A, the discharge amount of the fourth droplet and thereafter is substantially the same, and the droplet discharge amount thereof is vc. The droplet discharge amount of the fourth droplet and thereafter may naturally be gradually modified.

Here, the dot 100 is a dot that can be formed at a prescribed droplet deposition point with the ink discharged in the droplet discharge amount v1, and the diameter thereof is D1. In the same manner, the diameter of the dot 102 is D2, the diameter of the dot 104 is D3, and the diameter of the dot 106 and the ink discharged after dot 106 is Dc.

However, as used herein, the terms "dots 102 to 106" refer to imaginary dots that can be formed at prescribed droplet deposition points (landing points) when the ink droplets are discharged in isolation. The ink droplets come together due to aggregation that occurs at the time of landing, and the shape is formed in accordance with shape of ink droplets that have come together.

In order to bring about a line width of h=D of the line drawing 140, the droplet discharge amounts v1 to v3, and vc of the dots are adjusted. Considering the fact that the droplet discharge amount of the second droplet and thereafter increases, the width is at least h>D1.

Figure 8C:
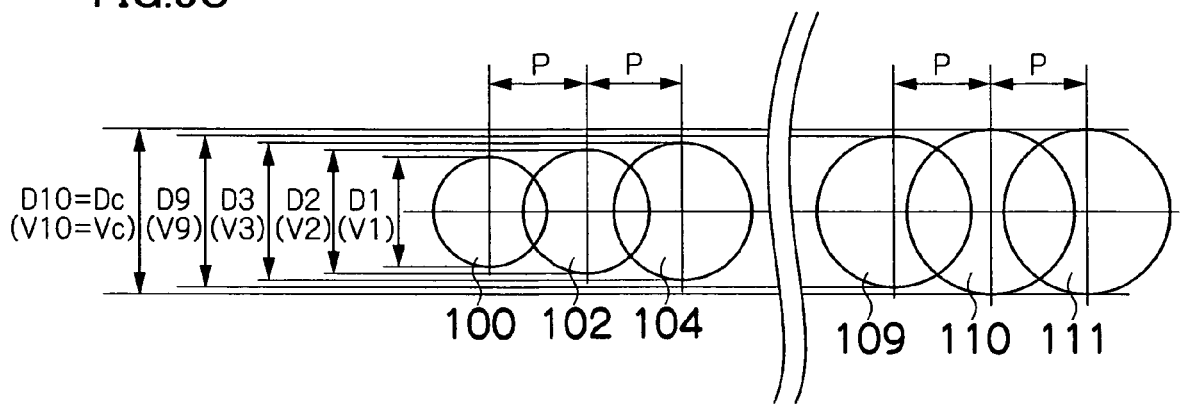

FIG. 8C shows an aspect in which the droplet discharge amounts v1 to v10 from the 1st droplet to the 10th droplet are gradually modified, and the droplet discharge amount of the 11th droplet and thereafter is set to the droplet discharge amount v10 (=vc) of the 10th droplet. The dot diameter of the dots 100 to 110 is D1 to D10, and D1<D2<D3< . . . <D9<D10=D11=Dc, as shown in FIG. 8C. The aspect shown in FIG. 8C is preferred when forming a relatively long line drawing.

To increase the droplet diameter of the ink droplets at the time of landing, the flight velocity of the ink droplets may be increased in addition to the technique of increasing the droplet discharge amount.

The droplet discharge amount or the flight velocity of the third ink droplet and those thereafter may be modified in comparison with the first ink droplet (the droplet discharge amount or the flight velocity may be modified in a stepwise manner), and the droplet discharge amount or the flight velocity may be modified in comparison with the ink droplet discharged immediately prior thereto (the droplet discharge amount or the flight velocity may be successively modified).

In this manner, the contact surface area with the recording paper 16 when the ink droplet has landed is modified by changing the flight velocity, and an effect equivalent to the droplet discharge amount control described above can be obtained.

Figure 9A:
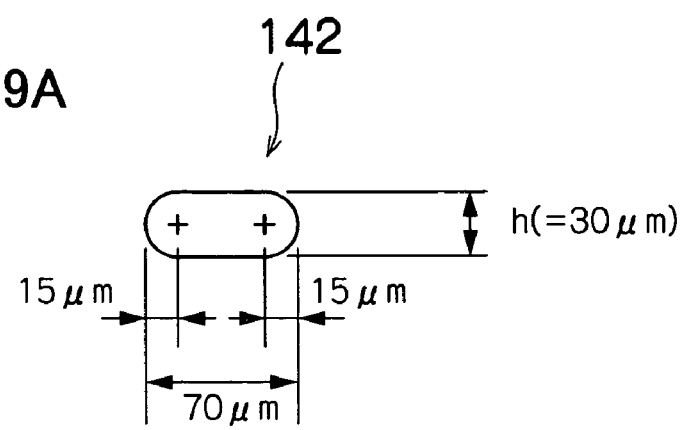
FIGS. 9A to 9C are diagrams showing a line drawing formed with the application of the droplet discharge control shown in FIGS. 8A to 8C.
Figure 9B:
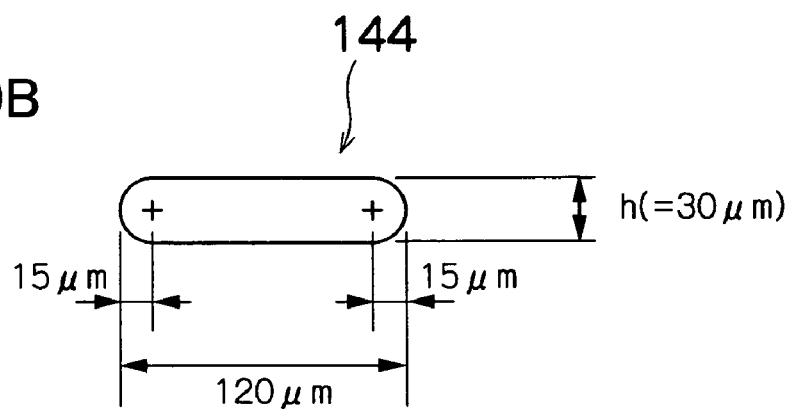
Figure 9C:
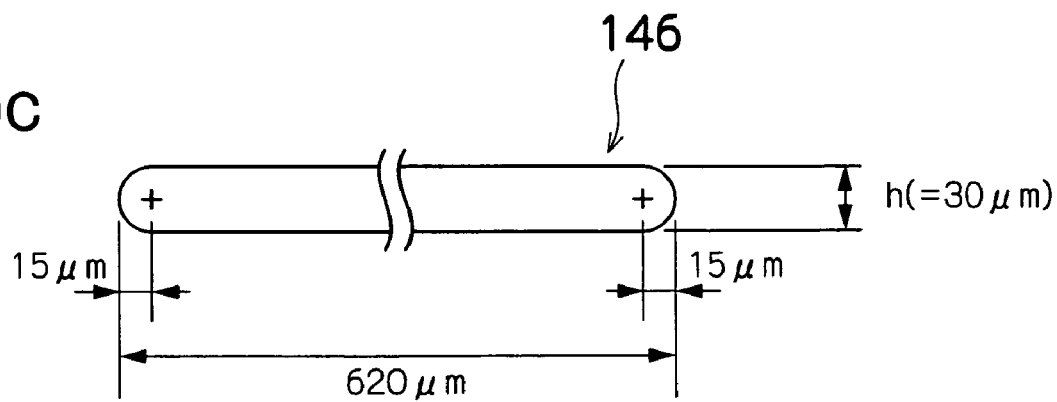

FIG. 9A shows a line drawing 142 with a length of 70 μm formed by five ink droplets that can form dots with diameters of 30 μm using 2 pL per droplet, and FIGS. 9B and 9C show a line drawing 144 with a length of 120 μm formed by 10 ink droplets, and a line drawing 146 with a length of 620 μm formed by 60 ink droplets. It should be noted that the length of the line drawing may be less than the above-described values.

Figure 14A:
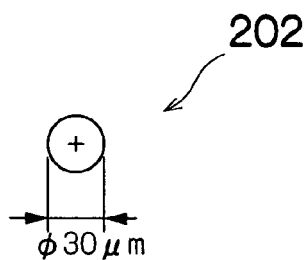
FIGS. 14A to 14D are diagrams showing a line drawing formed with the application of the droplet discharge control shown in FIGS. 13A and 13B.
Figure 14B:
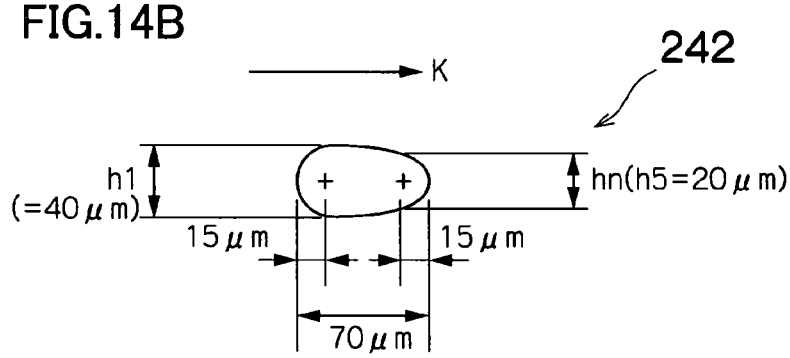
Figure 14C:
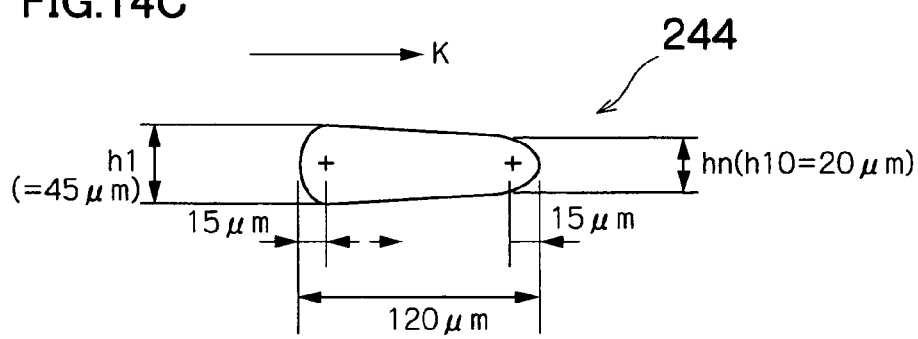
Figure 14D:
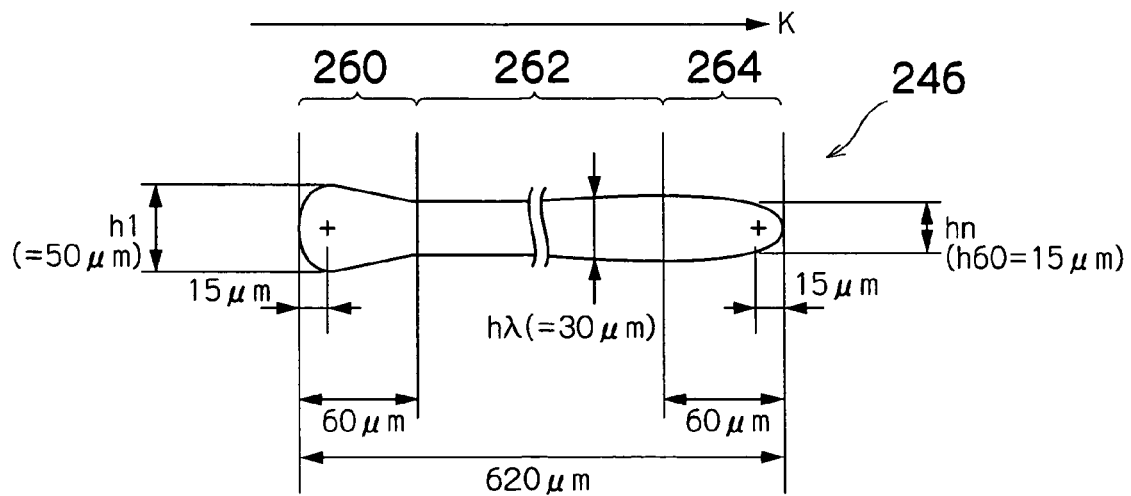
Figure 15A:
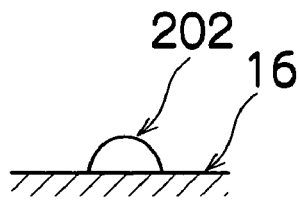
FIGS. 15A to 15D are cross-sectional diagrams showing the three-dimensional shape of the line drawing shown in FIGS. 14A to 14D.
Figure 15B:
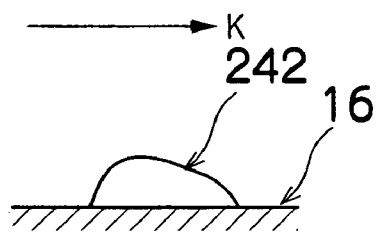
Figure 15C:
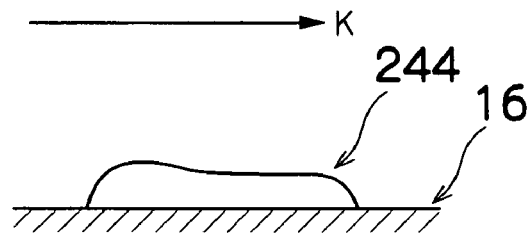
Figure 15D:
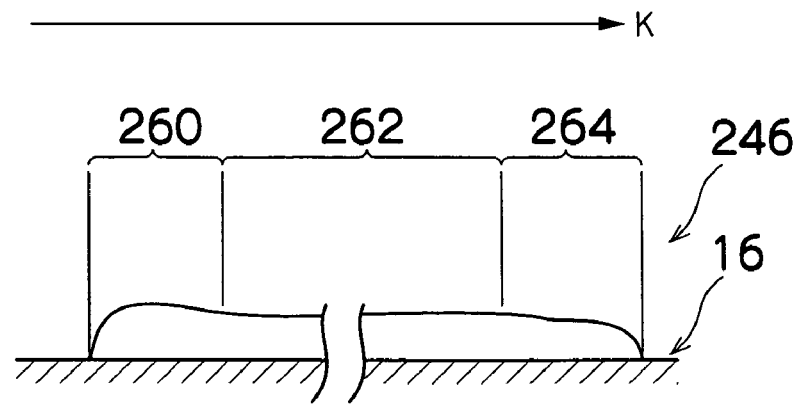

When forming a long line drawing 146 such as shown in FIGS. 9A to 9C, control for modifying the droplet discharge amount or control for modifying the flight velocity is applied in the writing start area 260 and the writing end area 264 because the line width in the writing start area 260 and the writing end area 264 is changing, as shown in FIG. 14D, and droplets may be discharged without modifying the droplet discharge amount or the flight velocity in the intermediate area 262. Moreover, control for modifying the droplet discharge amount or control for modifying the flight velocity may be applied only in the writing start area 260.

In the present embodiment, 10 droplets are discharged to the writing start area 260 and the writing end area 264 (in FIG. 14D, the writing start area 260 extends 60 μm from the writing start side, and the writing end area 264 extends 60 μm from the writing end side). The writing start area 260 and the writing end area 264 are naturally not limited to 10 droplets (10 droplet discharges), and a preferred aspect is one that can suitably modify the number of droplets in accordance with the type of recording paper and the type of ink. Even more preferable is an aspect in which the type of recording paper and the type of ink are determined and the writing start area 260 and the writing end area 264 are automatically switched.

The line drawings 142 to 146 shown in FIGS. 9A to 9C have substantially the same width h (30 μm) as the dot diameters (30 μm in FIGS. 9A to 9C) formed when the ink droplets are formed isolation. It should be noted that the numerical values shown in FIGS. 9A to 9C are merely examples and do not show the applicable scope of the present invention.

Furthermore, in the case of continuous printing in which the number of ink droplets exceeds five droplets, a line drawing with a uniform width can be formed by adjusting the droplet discharge amount so as to be gradually increased.

When a droplet lands nearby (adjacent) before a droplet completes permeation and the droplets come together to form a line drawing in the droplet discharge control in the inkjet recording apparatus 10 configured as described above, since droplet discharge is controlled so that the droplet discharge amount (discharge quantity) of a droplet and droplets in the vicinity thereof are different even when the original image is composed of lines with the same density, the printing density of a single line can be made constant, the printing result of a single line can be formed in a fixed shape, and higher-definition printing is made possible.

Second Embodiment

Next, the droplet discharge control of the second embodiment of the present invention is described with reference to FIGS. 10A and 10B, and FIG. 11.

Figure 10A:
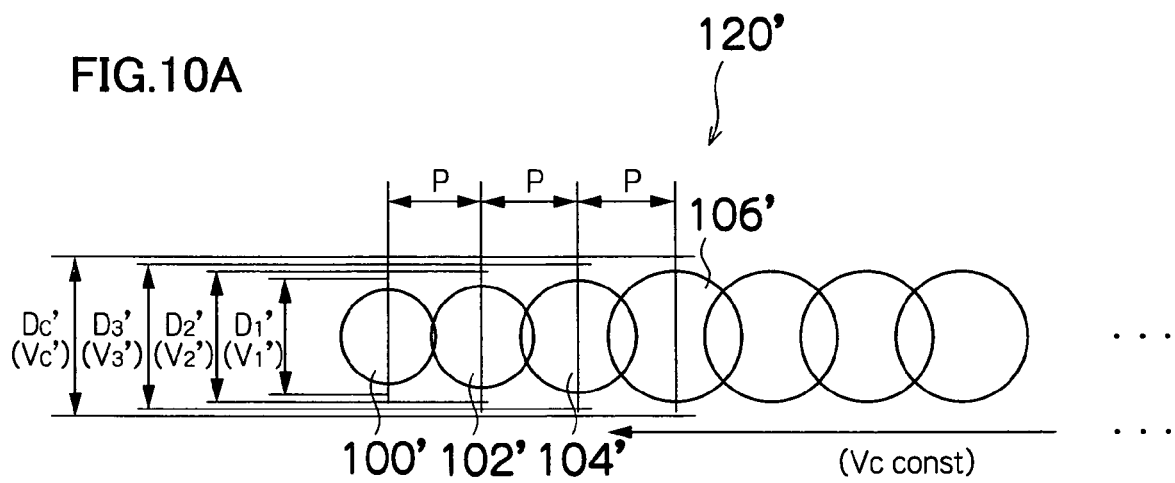
FIGS. 10A and 10B are diagrams describing the droplet discharge control of the second embodiment of the present invention.
Figure 10B:
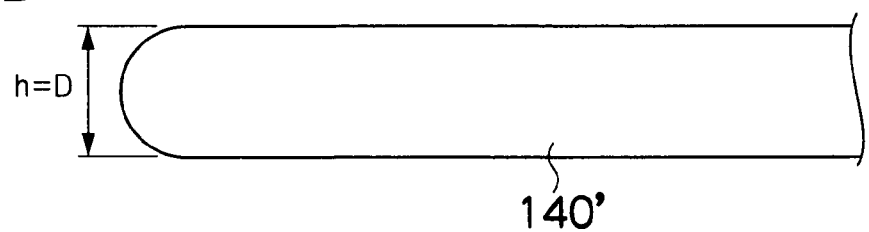

FIG. 10A shows a row 120' of dots that forms a line drawing 140' formed with the application of the present droplet discharge control, and FIG. 10B shows the line drawing 140'. It should be noted that in FIGS. 10A and 10B the same key symbols are assigned to the same or similar portions as FIGS. 8A to 8C, and a description thereof is omitted.

In the present droplet discharge control, anticipating that the line width of the writing start area will increase when the line drawing 140 with a width of h=D is formed by successive droplet discharges, the droplet discharge amount of the ink droplets immediately after writing has started is reduced in advance, and the droplet discharge amount is thereafter increased so as to gradually approach the original droplet discharge amount.

In other words, assuming that the ink amount of the first droplet is v1' (dot diameter D1' when the ink droplet forms the dot 100' in isolation, where D>D1'), the ink amount of the second droplet is v2' (dot diameter D2' when the ink droplet forms the dot 102' in isolation), the ink amount of the third droplet is v3' (dot diameter D3' when the ink droplet forms the dot 104' in isolation), and the droplet discharge amount of the fourth ink droplet and thereafter is vc' (dot diameter Dc' when the ink droplet forms the dot 106' in isolation), the droplets are discharged so that v1'<v2'<v3'<vc' (D1'<D2'<D3'<Dc'line width of the line drawing 140 can be made uniform across the entire length.

It should be noted that in the present example as well, when a long line drawing is formed, the present droplet discharge control can be applied at least in the writing start area and writing end area thereof, as shown in the first embodiment.

Described next is an aspect in which the percentage (correction amount) by which the discharge amount of the ink droplet is modified is determined by the graph shown in FIG. 11.

In the writing start area (key symbol 260 in FIG. 14D, for example), it is assumed that the discharge amount of the first ink droplet to be discharged is v1, the discharge amount of the second ink droplet to be discharged is v2, the discharge amount of the third ink droplet to be discharged is v3, the discharge amount of the i-th ink droplet to be discharged is vi, and the discharge amount (fixed amount) of the ink droplets in the intermediate area (key symbol 262 in FIG. 14D, for example) is vc, and the droplet discharge amounts v1, v2, v3, . . . , and vi are controlled so that v1/vc<v2/vc<v3/vc< . . . <vi/vc.

The pattern of variation of G1, G2, G3, . . . , Gi is set as shown in graph 180 of FIG. 11 when the values of G are defined as follows: G1=v1/vc, G2=v2/vc, G3=v3/vc, . . . , Gi=vi/vc, In other words, discharge is controlled so that the droplet discharge amount is corrected to a greater extent with an increase in the tension of the surface droplets (ink droplets on the surface of the recording paper 16) due to aggregation.

The patterns A, B, C, and D of the graph 180 are selected by the amount of overlap between the surface droplet of the previously landed ink droplet and the surface droplet of the subsequently landed ink droplet, and by the magnitude of the surface tension of the surface droplets.

Pattern D of the graph 180 is used when the amount of overlap and surface tension are low, and as the value of these variables increase, control is carried out to switch the percentages of the correction amount from pattern C to pattern B to pattern A.

Figure 11:
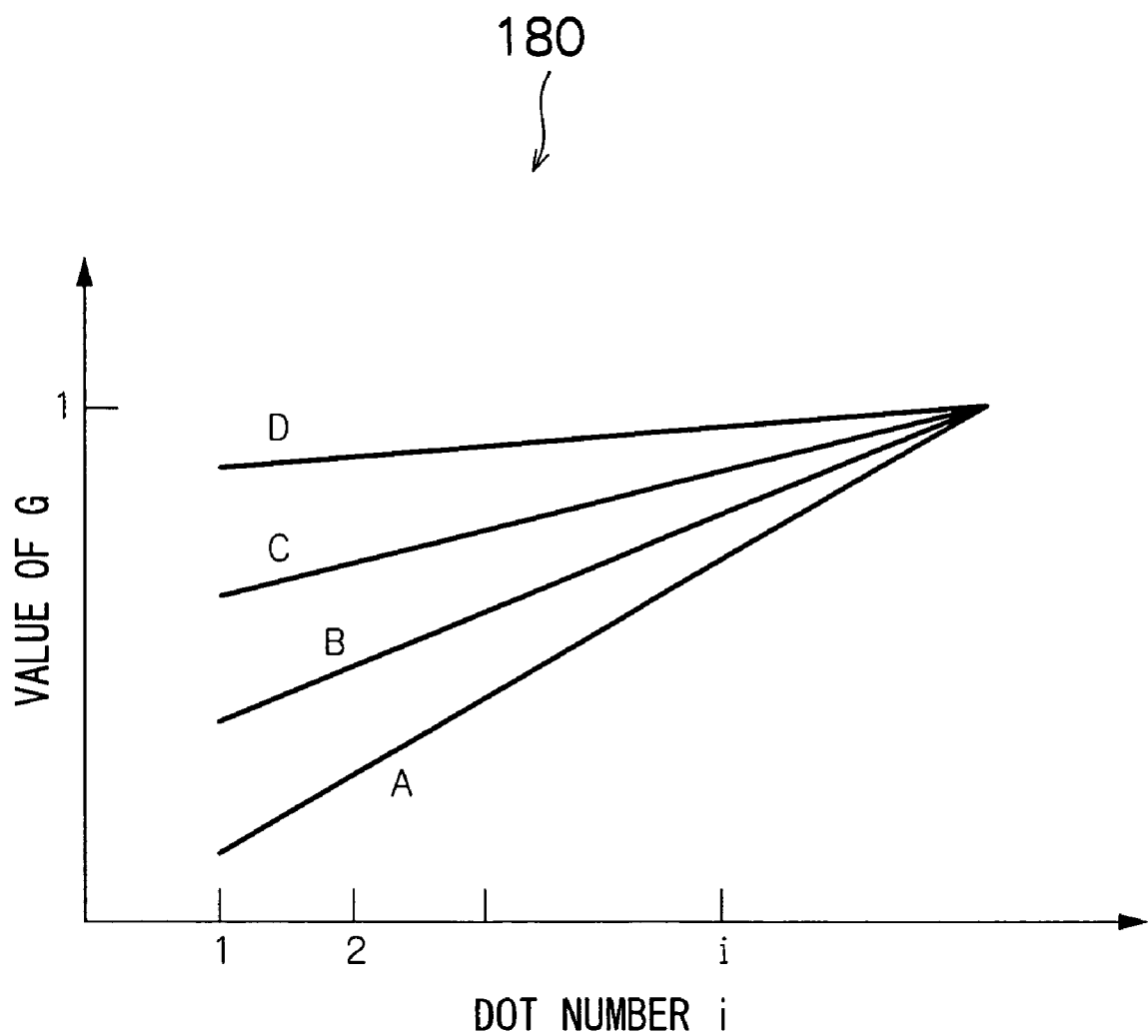
FIG. 11 is a graph showing an example of a pattern of droplet discharge corrections.

In other words, the ratio of the droplet discharge amounts are plotted on the graph 180 shown in FIG. 11 as the amount of overlap of the surface droplet or the surface tension of the surface droplets is reduced in accordance with the pattern A, pattern B, pattern C, and pattern D.

It should be noted that the droplet discharge amount of ink in the patterns may be converted into the form of a data table, prerecorded in memory 74 or other recording device shown in FIG. 7, and discharge may be controlled with reference to the data table when carrying out successive droplet discharges.

It should also be noted that the correction patterns depicted in the graph 180 of FIG. 11 show linear correction examples, but a curve such as $x^{1/2}$, for example, may be used.

It is also possible to correct the flight velocity in addition to correcting the droplet discharge amount using the same method as the present example.

Figure 12A:
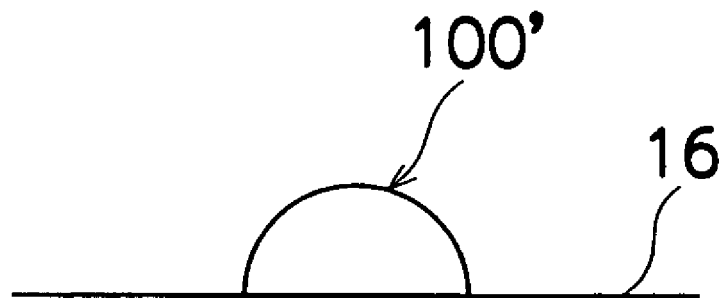
FIGS. 12A to 12C are diagrams describing an aspect of droplet discharge correction.
Figure 12B:
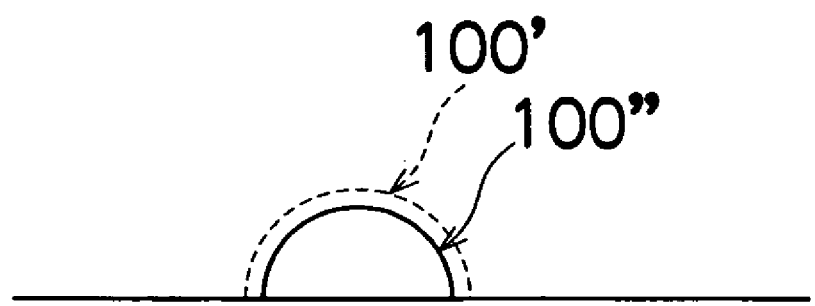
Figure 12C:
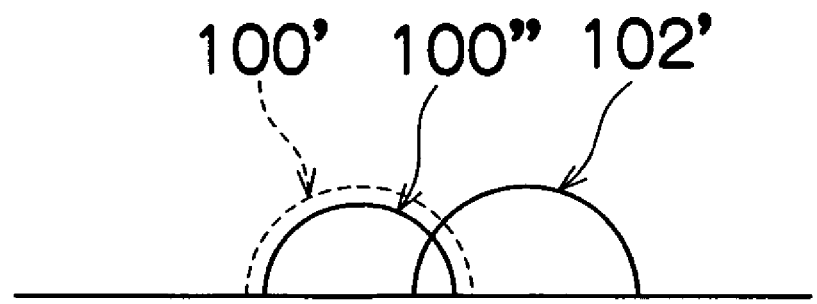
Figure 13A:
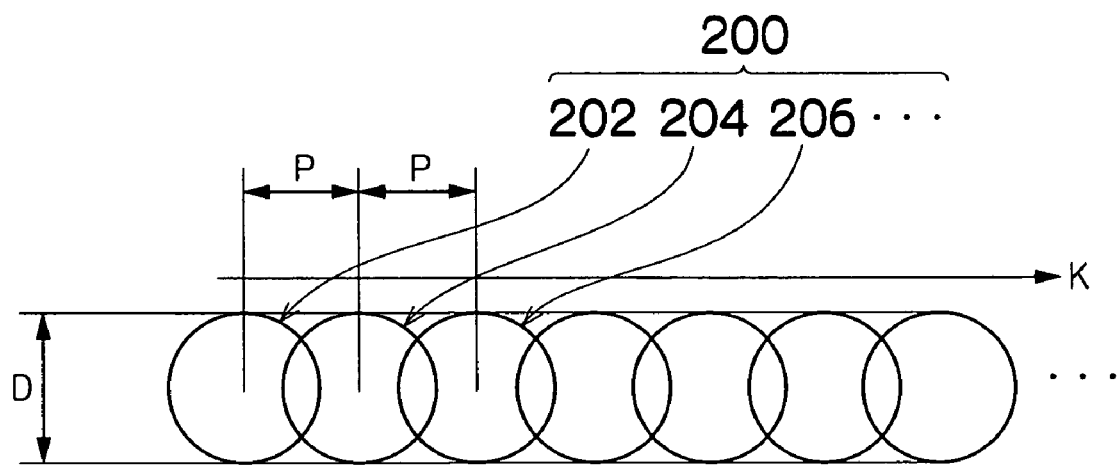
FIGS. 13A and 13B are diagrams describing droplet discharge control of the related art.
Figure 13B:
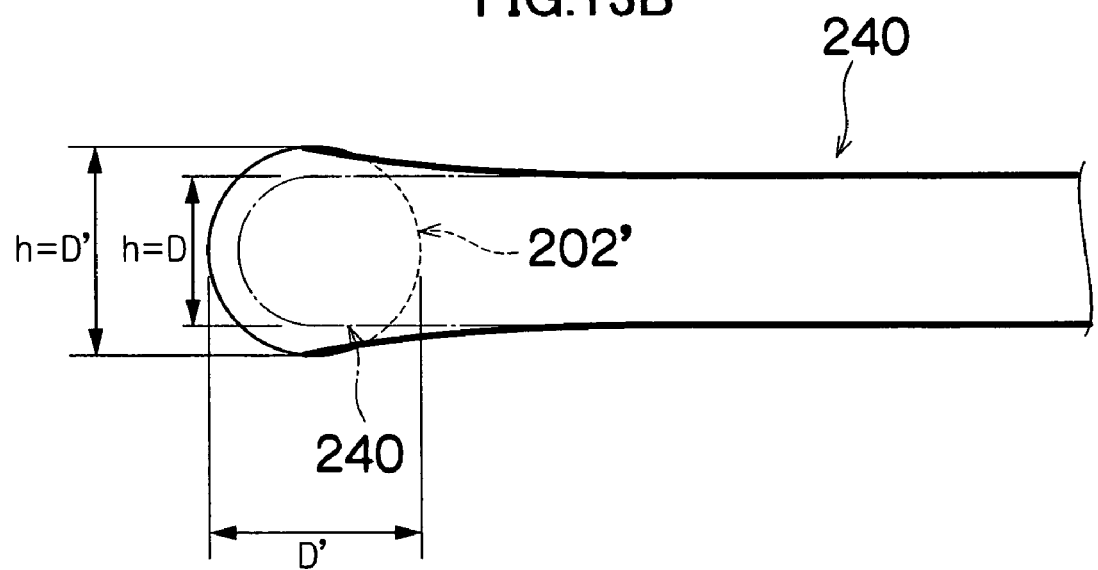

FIGS. 12A to 12C show an example of controlling ink droplet discharges so that the next ink droplet lands at a timing at which the remaining droplet amount of the ink droplet previously landed on the recording paper 16 has a volume that is 90% of that at the time of landing.

FIG. 12A shows the first (previously landed) ink droplet 100'. The ink droplet 100' permeates the recording paper 16, and droplet discharge is controlled so that the second (subsequently landing) ink droplet lands on the recording paper 16 at a timing at which the volume (droplet amount) is 90% at the time of landing shown (shown with a solid line) by the key symbol 100" in FIG. 12B. With this type of discharge control, it is possible to form a line drawing in which the line width is substantially uniform across the entire length without reducing the droplet discharge frequency.

The diameter of the previously landed ink droplet and the diameter of the subsequently landed ink droplet are preferably substantially the same at the time of landing of the subsequently landed ink droplet.

In the droplet discharge in the inkjet recording apparatus 10 configured as described above, anticipating in advance that the line width immediately after the writing start will increase and controlling the droplet discharge amount in the writing start area so as to be less than a prescribed amount allows the line width to be made uniform across the entire length of the line drawing 140', and the desired line width (originally intended line width) to be obtained. Also, since the percentage by which the droplet discharge amount is changed can be modified in accordance with the amount of droplet overlap and the surface tension between the droplets, the dot diameter can reliably be made more uniform.

In the above-described embodiment, an aspect is exemplified in which a substantially linear line drawing 140 or the like is formed in a certain direction (main scanning direction, for example), but the present invention may also be applied when forming a curved line drawing and a line drawing that combines lines and curves.

The formation direction of the line drawing is not limited to the sub-scanning direction, and the formation direction may also be the main scanning direction. The formation direction may be a diagonal direction that has a main scanning direction component and a sub-scanning direction component.

The following aspects are examples of applying the present embodiment.

In a print head that combines a print head that discharges droplets to odd-numbered droplet deposition points and a print head that discharges droplets to even-numbered droplet deposition points, droplets are simultaneously discharged to the odd-numbered deposition points, droplets are discharged to even-numbered deposition points according to a droplet discharge cycle with a short time interval (for example, as shown in FIGS. 12A to 12C, time until the remaining ink droplet amount is 90% of the ink droplet amount at the time of landing), and when a total of three or more droplets are discharged, the spreading of the droplet to be subsequently discharged may be designed to be drawn equally to both sides without being drawn nonuniformly to only one of the droplets. A print head that discharges droplets to odd-numbered droplet deposition points and a print head that discharges droplets to even-numbered droplet deposition points may be separately provided.

Exemplified in the embodiment described above is a print head used in an inkjet recording apparatus as a droplet discharge head, but the present invention may also be applied to a discharge head used in liquid discharge apparatuses that discharge liquids (water, chemical solutions, resists, treatment fluids) onto substrates such as wafers, glass substrates, substrates made of epoxy or the like, or other discharge receiving media to form images, circuit patterns, machining patterns, and other three-dimensional shapes.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of controlling droplet discharge for a liquid discharge apparatus which discharges droplets from a discharge head onto a discharge receiving medium, the method comprising the steps of:

successively discharging a plurality of droplets from the discharge head so that at least some of the droplets discharged to mutually adjacent deposition points on a surface of the discharge receiving medium overlap;

modifying flight velocity of the droplets so that the flight velocity of at least some of the droplets of the plurality of successively discharged droplets relatively increases sequentially; and causing droplets to be subsequently discharged to land on the recording medium at a timing at which a percentage of remaining droplet amount of a previously discharged droplet on the discharge receiving medium is 90% or higher with respect to the droplet discharge amount at the time of landing.

2. A liquid discharge apparatus, comprising:

a discharge head which discharges droplets onto a discharge receiving medium; and a control device which, when a plurality of droplets are successively discharged from the discharge head so that at least some of the droplets discharged to mutually adjacent deposition points on a surface of the discharge receiving medium overlap, selects at least one form of control from control which modifies a droplet discharge amount so that the droplet discharge amount of at least some of the droplets of the plurality of successively discharged droplets becomes relatively larger sequentially, and control which modifies flight velocity of the droplets so that the flight velocity of at least some of the droplets of the plurality of successively discharged droplets relatively increases sequentially, wherein the control device carries out droplet discharge control that causes droplets to be subsequently discharged to land on the recording medium at a timing at which a percentage of remaining droplet amount of a previously discharged droplet on the discharge receiving medium is 90% or higher with respect to the droplet discharge amount at the time of landing.

3. A liquid discharge apparatus, comprising:

a discharge head which discharges droplets onto a discharge receiving medium; and a control device which, when a plurality of droplets are successively discharged from the discharge head so that at least some of the droplets discharged to mutually adjacent deposition points on a surface of the discharge receiving medium overlap, selects at least one form of control from control which modifies a droplet discharge amount so that the droplet discharge amount of at least some of the droplets of the plurality of successively discharged droplets becomes relatively larger sequentially, and control which modifies flight velocity of the droplets so that the flight velocity of at least some of the droplets of the plurality of successively discharged droplets relatively increases sequentially, wherein the control device modifies at least one of a percentage in which the droplet discharge amount of the droplets to be subsequently discharged is made relatively larger than that of the previously discharged droplet, and a percentage in which the flight velocity of the droplet to be subsequently discharged is made relatively greater than that of the previously discharged droplet in accordance with at least one parameter selected from an amount of overlap of the previously discharged droplet and the droplet to be subsequently discharged on the discharge receiving medium, and a surface tension that operates between the previously discharged droplet and the droplet to be subsequently discharged.

4. A method of controlling droplet discharge for a liquid discharge apparatus which discharges droplets from a discharge head onto a discharge receiving medium, the method comprising the steps of:

successively discharging a plurality of droplets from the discharge head so that at least some of the droplets discharged to mutually adjacent deposition points on a surface of the discharge receiving medium overlap;

modifying flight velocity of the droplets so that the flight velocity of at least some of the droplets of the plurality of successively discharged droplets relatively increases sequentially; and modifying at least one of a percentage in which the droplet discharge amount of the droplets to be subsequently discharged is made relatively larger than that of the previously discharged droplet, and a percentage in which the flight velocity of the droplet to be subsequently discharged is made relatively greater than that of the previously discharged droplet in accordance with at least one parameter selected from an amount of overlap of the previously discharged droplet and the droplet to be subsequently discharged on the discharge receiving medium, and a surface tension that operates between the previously discharged droplet and the droplet to be subsequently discharged.

* * * * *